US009270412B2

(12) United States Patent
Perry et al.

(10) Patent No.: US 9,270,412 B2
(45) Date of Patent: Feb. 23, 2016

(54) PERMUTE CODES, ITERATIVE ENSEMBLES, GRAPHICAL HASH CODES, AND PUNCTURING OPTIMIZATION

(71) Applicants: Jonathan Perry, Cambridge, MA (US); Hari Balakrishnan, Belmont, MA (US); Devavrat D. Shah, Newton, MA (US)

(72) Inventors: Jonathan Perry, Cambridge, MA (US); Hari Balakrishnan, Belmont, MA (US); Devavrat D. Shah, Newton, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 14/314,347

(22) Filed: Jun. 25, 2014

(65) Prior Publication Data

US 2015/0003557 A1 Jan. 1, 2015

Related U.S. Application Data

(60) Provisional application No. 61/839,615, filed on Jun. 26, 2013.

(51) Int. Cl.
*H04L 1/00* (2006.01)
*H04L 1/08* (2006.01)
*H03M 13/25* (2006.01)
*H03M 13/27* (2006.01)

(52) U.S. Cl.
CPC .............. *H04L 1/0009* (2013.01); *H04L 1/0041* (2013.01); *H04L 1/0054* (2013.01); *H04L 1/0058* (2013.01); *H04L 1/0068* (2013.01); *H04L 1/0071* (2013.01); *H04L 1/08* (2013.01); *H03M 13/251* (2013.01); *H03M 13/2742* (2013.01)

(58) Field of Classification Search
CPC ....... H04L 27/34; H04L 1/0054; H04L 1/006; H04L 25/4975; H04L 65/607; H04L 1/0057; H04L 25/03286
USPC ......... 375/261–262, 265, 267, 340–341, 347, 375/358
See application file for complete search history.

(56) References Cited

U.S. PATENT DOCUMENTS

| | | | | |
|---|---|---|---|---|
| 5,903,549 A | * | 5/1999 | von der Embse et al. | 370/310 |
| 6,029,264 A | * | 2/2000 | Kobayashi et al. | 714/755 |
| 6,154,541 A | * | 11/2000 | Zhang | H04L 9/3073 380/28 |
| 6,765,507 B2 | * | 7/2004 | Yokokawa et al. | 341/50 |
| 7,206,364 B2 | | 4/2007 | Miller | |
| 7,239,667 B2 | * | 7/2007 | Shen et al. | 375/265 |
| 7,318,185 B2 | * | 1/2008 | Khandani et al. | 714/758 |
| 7,372,802 B2 | * | 5/2008 | Breiling et al. | 370/206 |

(Continued)

OTHER PUBLICATIONS

Office Action dated Jul. 31, 2014 for U.S. Appl. No. 13/901,667, filed May 24, 2013 9 pages.

(Continued)

*Primary Examiner* — Emmanuel Bayard
(74) *Attorney, Agent, or Firm* — Daly, Crowley, Mofford & Durkee, LLP

(57) ABSTRACT

Described herein are new error-correction (channel) codes: permute codes, iterative ensembles of permute and spinal codes, and graphical hash codes. In one aspect, a wireless system includes an encoder configured to encode data using one of the aforementioned channel codes. The wireless system also includes a decoder configured to decode the encoded data.

28 Claims, 19 Drawing Sheets

(56) References Cited

U.S. PATENT DOCUMENTS

| | | | |
|---|---|---|---|
| 7,457,411 B2* | 11/2008 | Soliman | H04L 9/0822 380/44 |
| 7,487,355 B2* | 2/2009 | Pelly et al. | 713/176 |
| 7,564,775 B2* | 7/2009 | Jayaraman et al. | 370/208 |
| 7,627,056 B1* | 12/2009 | Harris et al. | 375/296 |
| 7,711,066 B2* | 5/2010 | Jiang et al. | 375/296 |
| 7,865,799 B2* | 1/2011 | Sawaguchi | 714/755 |
| 7,954,016 B2* | 5/2011 | Pan et al. | 714/701 |
| 7,957,482 B2* | 6/2011 | Golitschek Edler Von Elbwart et al. | 375/261 |
| 7,986,752 B2* | 7/2011 | Nikopour-Deilami et al. | 375/341 |
| 8,040,981 B2 | 10/2011 | Amiri et al. | |
| 8,090,049 B2* | 1/2012 | Kent et al. | 375/296 |
| 8,209,580 B1* | 6/2012 | Varnica et al. | 714/752 |
| 8,261,079 B2 | 9/2012 | Newman et al. | |
| 8,315,325 B2* | 11/2012 | Lee et al. | 375/267 |
| 8,385,445 B2* | 2/2013 | Vitale et al. | 375/261 |
| 8,468,396 B2* | 6/2013 | Wu et al. | 714/701 |
| 8,503,552 B2* | 8/2013 | Pfletschinger | 375/260 |
| 8,537,787 B2* | 9/2013 | Qu et al. | 370/335 |
| 8,537,919 B2* | 9/2013 | Fonseka et al. | 375/265 |
| 8,559,543 B1 | 10/2013 | Lee et al. | |
| 8,599,946 B2* | 12/2013 | Kim et al. | 375/267 |
| 8,683,274 B1* | 3/2014 | Varnica et al. | 714/704 |
| 8,693,559 B2* | 4/2014 | Shaw et al. | 375/260 |
| 8,724,715 B2 | 5/2014 | Perry et al. | |
| 8,761,318 B2* | 6/2014 | Drumm et al. | 375/341 |
| 8,792,325 B1* | 7/2014 | Narasimhan | 370/207 |
| 8,797,972 B2* | 8/2014 | Kwon et al. | 370/329 |
| 8,798,201 B2* | 8/2014 | Kim | 375/299 |
| 8,799,735 B2* | 8/2014 | Wu et al. | 714/752 |
| 8,811,509 B2* | 8/2014 | Shen et al. | 375/264 |
| 8,848,842 B2* | 9/2014 | Dick | 375/341 |
| 8,891,763 B2* | 11/2014 | Tomlinson et al. | 380/30 |
| 8,948,100 B2* | 2/2015 | Jeong | H04L 5/0023 370/329 |
| 8,971,435 B2* | 3/2015 | Dhakal et al. | 375/267 |
| 2001/0033621 A1* | 10/2001 | Khayrallah | 375/244 |
| 2002/0056064 A1* | 5/2002 | Kidorf | H03M 13/151 714/755 |
| 2003/0138055 A1 | 7/2003 | Saito et al. | |
| 2005/0135498 A1 | 6/2005 | Yee | |
| 2006/0048038 A1* | 3/2006 | Yedidia et al. | 714/793 |
| 2006/0153312 A1* | 7/2006 | Yun et al. | 375/267 |
| 2006/0205357 A1* | 9/2006 | Kim | 455/69 |
| 2007/0149242 A1* | 6/2007 | Kim et al. | 455/525 |
| 2008/0165878 A1 | 7/2008 | Kajihara | |
| 2008/0233966 A1* | 9/2008 | Scheim et al. | 455/452.1 |
| 2008/0260053 A1* | 10/2008 | Yun et al. | 375/260 |
| 2009/0199069 A1 | 8/2009 | Palanki et al. | |
| 2009/0257530 A1 | 10/2009 | Shim et al. | |
| 2010/0067614 A1 | 3/2010 | Koslov et al. | |
| 2010/0100792 A1 | 4/2010 | Abu-Surra | |
| 2010/0153270 A1* | 6/2010 | Hawkes | G06F 21/36 705/44 |
| 2011/0299629 A1* | 12/2011 | Luby et al. | 375/299 |
| 2012/0063429 A1* | 3/2012 | Yang et al. | 370/338 |
| 2012/0106684 A1 | 5/2012 | Eckert | |
| 2013/0099901 A1* | 4/2013 | Jones et al. | 340/10.51 |
| 2013/0145239 A1* | 6/2013 | Pi et al. | 714/807 |
| 2013/0259149 A1* | 10/2013 | Dhakal et al. | 375/267 |
| 2013/0315347 A1 | 11/2013 | Fleming et al. | |
| 2013/0326630 A1* | 12/2013 | Argon | 726/26 |
| 2014/0072076 A1* | 3/2014 | Taherzadehboroujeni et al. | 375/299 |
| 2014/0136584 A1* | 5/2014 | Schumacher | G06F 7/58 708/250 |
| 2014/0169492 A1* | 6/2014 | Mandavifar et al. | 375/267 |
| 2014/0205036 A1* | 7/2014 | Kim | 375/267 |
| 2014/0211881 A1 | 7/2014 | Perry et al. | |
| 2014/0247910 A1* | 9/2014 | Drumm et al. | 375/341 |
| 2014/0334421 A1* | 11/2014 | Sosa et al. | 370/329 |
| 2014/0369434 A1* | 12/2014 | Taherzadehboroujeni et al. | 375/261 |
| 2015/0016577 A1* | 1/2015 | Varadaharajan et al. | 375/347 |
| 2015/0143446 A1* | 5/2015 | Lee et al. | 725/116 |
| 2015/0180509 A9* | 6/2015 | Fonseka et al. | 375/299 |

OTHER PUBLICATIONS

U.S. Appl. No. 14/230,165, filed Mar. 31, 2014, Perry et al.

Bahl et al.; "Optimal Decoding of Linear Codes for Minimizing Symbol Error Rate;" IEEE Transactions on Information Theory; Mar. 1974; pp. 284-287.

Berrou et al.; "Near Shannon Limit Error—Correcting Coding and Decoding: Turbo-Codes (1);" IEEE International Conference on Communication; May 1993; pp. 164-170.

Cheng et al.; "A 0.077 to 0.168 nJ/bit/iteration Scalable 3GPP LTE Turbo Decoder with an Adaptive Sub-Block Parallel Scheme and an Embedded DVFS Engine;" Massachusetts Institute of Technology, Dept. of Electrical Engineers and Computer Science; Sep. 2010; 5 sheets.

Cypher et al., "Generalized Trace-Back Techniques for Survivor Memory Management in the Viterbi Algorithm;" Journal of Very Large Scale Integration Signal Processing Systems, vol. 5, Issue 1; Jan. 1993; pp. 85-94.

Forney, Jr.; "The Viterbi Algorithm;" Proceedings of the IEEE, vol. 61, No. 3; Mar. 1973; pp. 268-278.

Lin et al.; "A 1000-Word Vocabulary, Speaker-Independent, Continuous Live-Mode Speech Recognizer Implemented in a Single FPGA;" Proceedings of the 2007 AMC/SIGDA 15th International Symposium on Field Programmable Gate Arrays; Jan. 2007; 9 pages.

Ng et al.; "From WiFi to WiMAX: Techniques for High-Level IP Reuse Across Different OFDM Protocols;" IEEE/ACM International Conference of Formal Methods and Models for Codesign; May 2007; 10 sheets.

Paaske; "An Area-Efficient Path Memory Structure for VLSI Implementation of High Speed Viterbi Decoders;" Integration, the Very Large Scale Integration Journal, vol. 12, No. 2; Jan. 1991; pp. 79-91.

Perez et al.; VLSI Architecture for the M Algorithm Suited for Detection and Source Coding Applications; IEEE Proceedings of the 14th International Conference on Electronics, Communications and Computers; Jan. 2005; 6 sheets.

Perry et al.; Spinal Codes; Special Interest Group on Communications'12; Aug. 2012; pp. 49-60.

Power et al.; "Reduced Complexity Path Selection Networks for M-Algorithm Read Channel Detectors;" IEEE Transactions on Circuits and Systems—I: Regular Papers, vol. 55, No. 9; Oct. 2008; pp. 2924-2933.

PCT Partial Search Report of the ISA dated May 31, 2012; for PCT Pat. App. No. PCT/US2012-025612.

PCT Search Report and Written Opinion of the ISA dated Jul. 27, 2012; for PCT Pat. App. No. PCT/US2012/025612.

PCT International Preliminary Report on Patentability and Written Opinion dated Aug. 29, 2013 for PCT. Pat. Appl. No, PCT/US2012/025612.

U.S. Appl. No. 11/619,675; 300 pages; Part 1 of 3.
U.S. Appl. No. 11/619,675; 300 pages; Part 2 of 3.
U.S. Appl. No. 11/619,675; 209 pages; Part 3 of 3.
U.S. Appl. No. 12/629,374; 300 pages. Part 1 of 7.
U.S. Appl. No. 12/629,374; 300 pages. Part 2 of 7.
U.S. Appl. No. 12/629,374; 300 pages. Part 3 of 7.
U.S. Appl. No. 12/629,374; 300 pages. Part 4 of 7.
U.S. Appl. No. 12/629,374; 300 pages. Part 5 of 7.
U.S. Appl. No. 12/629,374; 300 pages. Part 6 of 7.
U.S. Appl. No. 12/629,374; 252 pages. Part 7 of 7.

Response to Office Action filed Nov. 19, 2014; to Office Action dated Jul. 31, 2014; for U.S. Appl. No. 13/901,667; 30 pages.

Office Action dated Feb. 4, 2015; for U.S. Appl. No. 13/901,667; 12 pages.

Notice of Allowance dated Jun. 10, 2015 for U.S. Appl. No. 13/901,667, 9 pages.

Restriction Requirement dated Dec. 3, 2014 corresponding to U.S. Appl. No. 14/230,165; 11 Pages.

(56) References Cited

OTHER PUBLICATIONS

Response to Restriction Requirement dated Dec. 3, 2014 corresponding to U.S. Appl. No. 14/230,165; Response Filed on Dec. 29, 2014; 1 Page.

Office Action dated Feb. 18, 2015 corresponding to U.S. Appl. No. 14/230,165; 9 Pages.

Response filed on May 14, 2015 to Non-Final Office Action dated Feb. 18, 2015; for U.S. Appl. No. 14/230,165; 11 pages.

Response to an of Action as filed on Jun. 2, 2015 for U.S. Appl. No. 13/901,667 (17 pages).

Notice of Allowance dated May 26, 2015 for U.S. Appl. No. 14/230,165 (11 pages).

\* cited by examiner

PERMUTE CODES, ITERATIVE ENSEMBLES, GRAPHICAL HASH CODES, AND PUNCTURING OPTIMIZATION

CROSS REFERENCE TO RELATED APPLICATIONS

This application claims the benefit of U.S. Provisional Application No. 61/839,615 filed Jun. 26, 2013, which application is incorporated herein by reference in its entirety.

STATEMENT REGARDING FEDERALLY SPONSORED RESEARCH

This invention was made with Government support under Grant No. CNS-1161964 awarded by the National Science Foundation (NSF). The Government has certain rights in the invention.

BACKGROUND

As is known in the art, emerging technology and increasing demand for large-scale high-speed data communications have made it important for systems to achieve efficient and reliable digital data transmission and storage. In particular, an important goal for many wireless network protocols is high throughput. In communication networks, throughput (also sometimes referred to as "network throughput") may be defined as the average rate of successful message delivery over a communication channel.

As is also known, channel conditions affect network throughput. Many factors degrade channel quality, including signal attenuation, noise, interference, and multipath fading. Wireless channels vary with time, sometimes even at timescales shorter than a packet time. Thus, to achieve high throughput, a protocol must not only operate at the best rate given a set of channel conditions but must also adapt to variations.

These problems are well-known, fundamental ones. Current wireless networks, including IEEE Standard 802.11 (Wi-Fi) and various wide-area cellular wireless standards, address such problems by providing a large number of physical layer (PHY) mechanisms, including a variety of channel codes, various parameters for these codes, and several modulations. Link and subnetwork layers implement policies to dynamically select and configure the discrete choices and parameters provided by the PHY. In 802.11 networks, for instance, this choice is generally made by a bit rate adaptation protocol by observing channel conditions, such as the signal-to-noise ratio (SNR), interference-free bit error rate, dispersion in constellation space, frame loss rate, or the time taken to successfully transmit a frame.

SUMMARY

Described herein are a new class of error-correction codes referred to as permute codes. Permute codes use pseudo-randomly chosen permutations of k-bit blocks of message to produce symbols for transmission over a noisy communication channel. These permutations, denoted herein by $\pi_{i,j} \in S_2^k$, produce pseudo-random permutations of k bits, where each permutation has a seed chosen according to the method described below. The resulting symbols are each mapped to constellation points and transmitted.

The receiver obtains a noisy version of the transmitted symbols. It explores a few highly probable constellation points given the received values to get suggestions for the original k bits. For channels having a relatively high signal to noise ratio (SNR), the explored space is substantially smaller than the brute force approaches that explore all $2^k$ points.

Owing to the special structure of the permutations, permute codes outperform spinal codes (and, by extension from previous results, other codes such as Raptor, LDPC, and Strider) for the same amount of investment in computational power at the decoder. Examples of spinal codes, and spinal code encoders and decoders, are described in U.S. patent application Ser. No. 13/339,436 (filed Feb. 17, 2012) and U.S. patent application Ser. No. 13/901,667 (filed May 24, 2013). Both applications are incorporated here by reference in their entirety.

In one aspect, a wireless system includes an encoder configured to encode data using a permute code, which uses a function and a method of generating pseudo-random permutations using a seed, over the message bits to produce a sequence of constellation symbols for transmission over a communication channel. The wireless system also includes a decoder configured to decode the permute code. In one example, the function may be at least one of a non-linear function and a hash function. In one example, the permute code may be used in a rateless or rated fashion. In one example, the decoder may be configured to provide feedback to the encoder.

In another aspect, a method of operating a wireless system, which includes a transmitter and a receiver, includes transmitting, via the transmitter, a permute coded message over a wireless channel; and receiving, via the receiver, the permute coded message over the wireless channel. In one example, the method may include providing feedback from the receiver to the transmitter. In one example, the method may also include, at a transmitter, generating a sequence of symbols using message bits; mapping each symbol to a constellation point; modulating constellation points on a carrier; and transmitting a signal using the carrier. In one example, the method may also include, at a receiver, mapping a signal from an encoder to points on an I-Q plane and decoding the points on the plane.

In a further aspect, a method to encode a message includes generating a sequence of symbols using message bits and mapping each symbol to a constellation point. In one example, the method may include modulating constellation points on a carrier and transmitting a signal using the carrier. In one example, the method may also include receiving feedback from a receiver and determining when to transmit based on an estimate of a distribution of the amount of symbols required to successfully decode. In one example, the method may further include dividing a message into non-overlapping segments of size k bits each, wherein k is an integer greater than zero, determining a series of n/k spine values, wherein n is an integer greater than zero and generating constellation points by making one or more passes over each of the n/k spine values.

In another further aspect, a method to decode includes mapping a signal from an encoder to points on an I-Q plane and decoding the points on the I-Q plane. In one example, the decoding may include exploring a decoding tree iteratively; and pruning at each iteration all but a defined amount of nodes. In one example, the method may include providing feedback to the encoder.

In another aspect, an encoder includes a non-transitory machine-readable medium that stores executable instructions. The instructions cause a machine to generate a sequence of symbols using message bits and map each symbol to a constellation point. In one example, the encoder may include instructions causing a machine to modulate constellation points on a carrier and transmit a signal using the carrier. In one example, the encoder may further include instructions causing a machine to receive feedback from a decoder and to determine when to transmit based on an estimate of a distribution of the amount of symbols required to successfully decode. The encoder may still further include instructions causing a machine to divide a message into non-overlapping segments of size k bits each, wherein k is an integer greater than zero, determine a series of n/k spine values, wherein n is an integer greater than zero; and generate constellation points by making one or more passes over each of the n/k spine values.

In a still further aspect, a decoder includes a non-transitory machine-readable medium that stores executable instructions. The instructions cause a machine to map signals from an encoder to points on an I-Q plane and decode a sequence of points.

In one example, the instructions causing the machine to decode may include instructions causing the machine to explore a decoding tree iteratively; and prune at each iteration all but a defined amount of nodes. In one example, the decoder may also include instructions causing a machine to provide feedback to the encoder.

In another aspect, a wireless system includes a transmitter that includes a non-transitory machine-readable medium that stores a first set of executable instructions. The first set of instructions cause a machine to obtain packets, divide a packet of N bits into multiple code blocks, include a cyclic redundancy check (CRC) for each code block, encode the code block in a rateless manner, determine how many passes and puncturing to send; and transmit encoded symbols to a receiver. In one example, the wireless system may include the receiver that includes a non-transitory machine-readable medium that stores a second set of executable instructions. The second set of instructions cause a machine to receive encoded symbols from the transmitter; decode the received symbols; check the CRCs; send a feedback signal to a transmitter if packets are not all successfully decoded; and send a final feedback signal to the transmitter if packets are successfully decoded.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more example embodiments. Accordingly, the figures are not intended to, and should not be construed as, limiting the scope of the concepts, systems, circuits and techniques described here. Like reference numerals in the figures denote like elements.

DETAILED DESCRIPTION

System Architecture Overview

Figure 1:
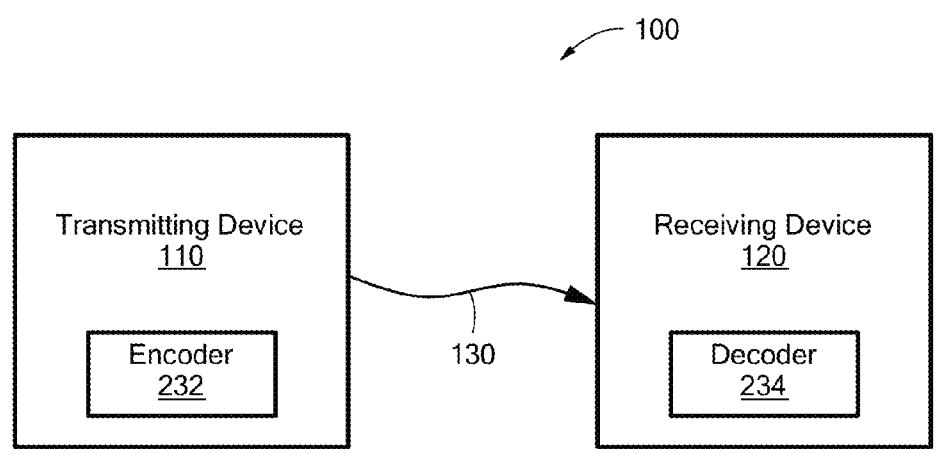
FIG. 1 is a block diagram of an example communication network.

FIG. 1 is a simplified schematic block diagram of an example communication network 100, illustratively comprising a transmitting device 110 ("transmitter" or "sender") and a receiving device 120 ("receiver") interconnected by a communication link 130, such as wireless communication. For instance, encoded wireless signals may be propagated from transmitting device 110 to receiving device 120 to be decoded, each as described in detail herein. The transmitting and receiving devices, such as radios, mobile phones, computers, and so forth, may be in communication with each other via the wireless communication medium based on, for example, distance, signal strength, current operational status, location, and so forth, and may generally be composed of half-duplex devices (able to transmit and receive, but not simultaneously). In such wireless communication schemes, electrical noise can be introduced onto the wireless signals. Those skilled in the art will understand that any number of devices may be used in a communication network, and that the view shown herein is for simplicity.

Data communications (e.g., signals) may comprise packets, frames, information, audio signals, video signals, and so forth, and may generally be considered to be digital encoded communication for the purposes of the embodiments herein. The signals 130 may be exchanged among the devices of the network 100 using predefined wireless communication protocols such as, e.g., IEEE Standard 802.11, IEEE Standard 802.15.4, WiFi, WiMax (IEEE Standard 802.16e), Bluetooth®, various proprietary protocols and so forth. In this context, a protocol consists of a set of rules defining how the nodes interact with each other. While the permute codes described below may be used on top of existing standards, permute codes (and RLP) may be used to replace the existing codes (and protocols) in new standards.

As will be further described herein the transmitting device 110 includes an encoder 232 to encode messages and the receiving device 120 includes a decoder 234 for decoding messages.

The rateless link protocol (RLP) described herein is by necessity different from the prior art, particularly in that RLP involves determining when to solicit feedback from the receiver. Through this may be avoided if full-duplex radios were standard, most current radios are half-duplex, and as such, the techniques described herein detail a practical rateless system that can work over such half-duplex radios as well.

Permute Codes

Encoding

Figure 2:
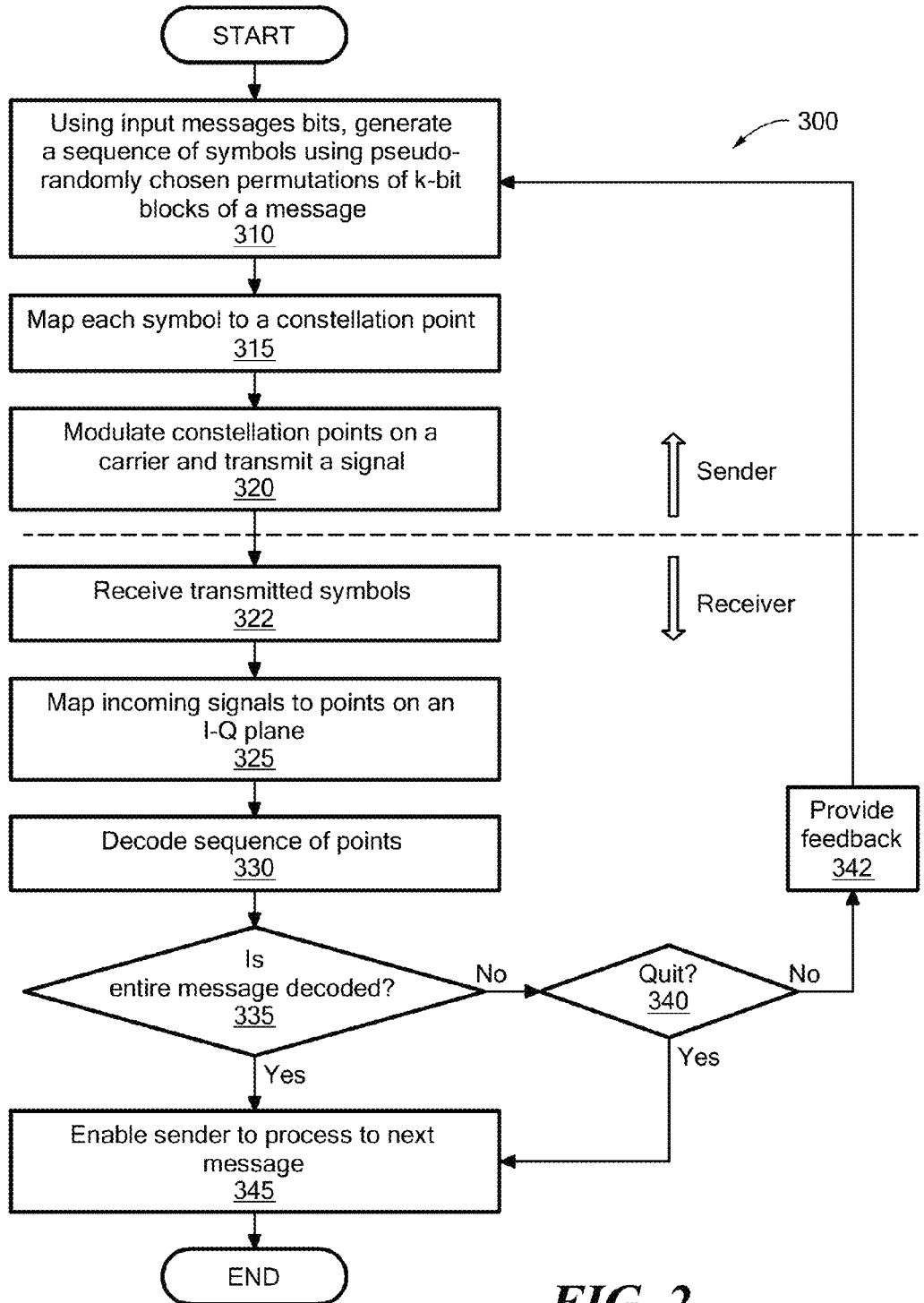
FIG. 2 is a flowchart of an example of a process to encode and to decode.

Referring to FIG. 2, an example of a process to encode and to decode is a process 300. In one example, processing blocks 310 to 320 are performed at a sender (e.g., the transmitting device 110) while processing blocks 322 to 345 are performed at a receiver (e.g., the receiving device 120).

Using input message bits, $M=m_1, m_2 \ldots m_n$, process 300 produces a sequence of symbols, where each symbol corresponds to some sequence of coded bits (310). The symbols may be generated using randomly chosen permutations of k-bit blocks of the message. Process 300 maps each symbol to a constellation point on an I-Q plane (315). A constellation point is a complex number, with the real and imaginary components signifying the in-phase, and quadrature components. Process 300 modulates each constellation point on a carrier and transmits the signal (320). Since permute codes are rateless, an encoder can produce as many coded constellation points as necessary from a given sequence of message bits. Note that processing blocks 310 and 315 generally suggest an embodiment where all symbols are pre-generated. In other examples, the symbols are not pre-generated but rather generated in an ad hoc fashion.

In process 300, the transmitted symbols are received by a receiver device (322) such as receiver 120 shown in FIG. 1. Process 300 maps incoming signals to points on the I-Q plane (325). For example, a physical layer (PHY) of the receiver (e.g., the receiving device 120) maps the incoming signals. Process 300 decodes the points on the I-Q plane to produce an estimate of what the sender's message bits were (330). Process 300 determines if the entire message is properly decoded (335) and if the entire message is decoded, enables the sender to process the next message (345). As used herein a "message" means a sequence of bits that are coded. In general a packet may be divided to multiple independent coded messages, each of which constitutes a code block.

If the entire message is not encoded, process 300 determines whether to quit (340). For example, process 300 may quit if a predetermined amount of time has elapsed: either because the packet becomes irrelevant, or because it can be assumed that some failure has occurred (e.g., the other side went into a tunnel and cannot communicate). If process 300 determines to quit, process 300 proceeds to processing block 345. If process 300 determines not to quit, process 300 provides feedback (342) (e.g. informs the transmitter that the message cannot be decoded) and the process begins again at block 310.

In one specific embodiment, permute codes may be characterized by one parameter that is generally specified by a user, which depends on the maximum rate desired for the communication link, where the "pre-coding stage" divides message M into smaller portions of size k. If the available bandwidth is W MHz and the desired maximum bit rate is Rmax M bits/s, then the maximum rate of the link is k=Rmax/W bits/symbol; i.e., k is the maximum rate (in bits/symbol) that the spinal code can achieve. An illustrative value for k may be fairly liberal. For instance, over the default IEEE Standard 802.11b/g bandwidth of 20 MHz, if k is chosen to be 8 bits/symbol, the maximum link bit rate will be 160 Megabits/s. If the bandwidth doubles to 40 MHz, the same k would provide a maximum bit rate of 320 Megabits/s. Similar performance can be obtained with k=4; i.e., 4 bits for the I component and 4 bits for the Q component of the symbol because I and Q are orthogonal to each other. With puncturing (explained below), higher rates can be achieved.

According to the techniques herein, the encoder and decoder agree a priori on certain elements: a first aspect that includes a hash function (and its initial seed value) and the functions Hi that derive coded bits from the spine, a second aspect that includes a permute function to choose permutations of k-bit blocks of a message to produce symbols for transmission, and a third aspect that includes a deterministic constellation mapping between the output of the hash function and a symbol to be transmitted. Note that as used herein, the coded-bit sequences are called symbols. So, the illustrative coding process described herein takes message bits, codes them into symbols, then maps symbols to constellation points, and then each constellation point is modulated to a carrier and transmitted. In addition, in certain embodiments, the length of each symbol C may be decided a priori, i.e., the number of coded bits that are incorporated into a single symbol. (This upper-bounds indicates how much information a single symbol can convey, i.e., the amount that should be achievable under zero noise.)

Figure 3:
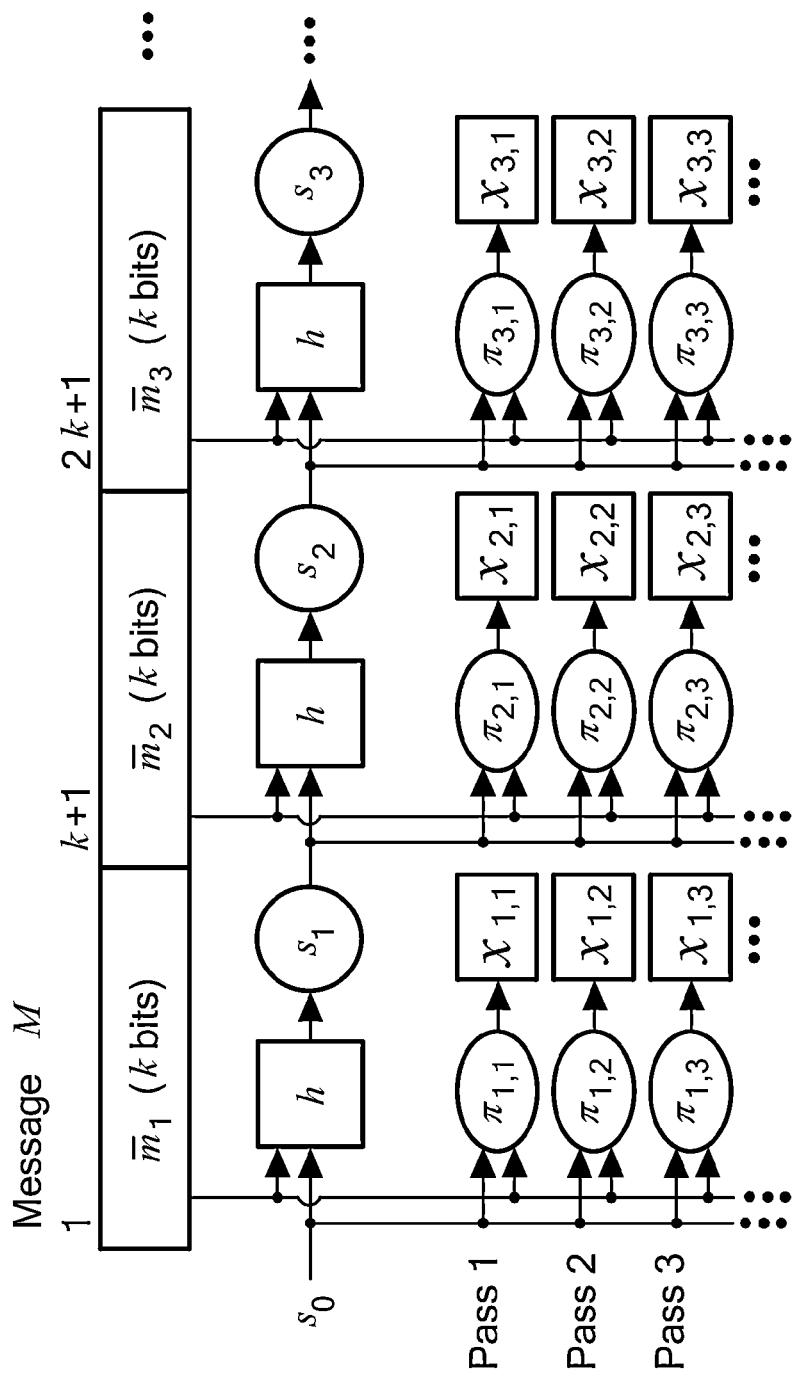
FIG. 3 is a block diagram of a permute encoder.

Referring now to FIG. 3, a permute encoder generates symbols as follows: A message M, size n bits, is first divided into n=k blocks of k bits: $m_1; m_2; \ldots m_{n/k}$. A vector of state variables, $s=(s_0; s_1 \ldots, )$ is updated iteratively with these blocks using an update function h: $s_i=h(s_{i-1}; m_i)$. The state variables $s_i$ may be referred to as spine values. Function h can be a hash function, a linear shift register, etc. The initial value $s_0$ is some value known to both the encoder and decoder. Values of s, such as $s_i$, are are generated based on the previous state variable $s_{i-1}$ and the block $m_i$ that is being encoded. As shown, the state variable $s_{i-1}$ and the block $m_i$ are inputs into the function h that produces the subsequent state variable $s_i$.

The permutations $\pi_{i,j}$ are systematic codes used to produce the encoded messages $x_{i,j}$. As shown in FIG. 3, the permute functions for a block $m_n$ take state variable $s_{n-1}$ and the block m to be encoded as inputs. The output of the permute function it is an encoded block $x_{n,j}$ that can be transmitted over the communication channel. The state variables $s_i$ depend on $m_1$; $m_2; \ldots m_i$. The permutations for the $i^{th}$ block depend on blocks up to i–1, so the code uses $s_{i-1}$ to derive the permutations. We denote by the mapping of permute functions that yields the permutations: $\pi_{i,j}=\Psi(S_{i-1}, i, j)$, The transmission corresponding to any given k-bit block, $m_i$, occurs in one or more passes, as indicated on the left hand side of FIG. 3. In each pass, sending the same symbol or set of symbols may not be desirable because that would be a simple (and inefficient) repetition code for that block. Hence, to exploit channel diversity, $\pi_{i,j}$ needs to change as a function of j. In contrast, i need not influence the choice of $\pi_{i,j}$ explicitly because we expect $s_i$ will change substantially as the encoding progresses through the message (specifically, when h is a hash function). In other words, because $s_i$ changes for each block $m_i$ being encoded (or decoded), and because $s_i$ is used to generate the permute functions $\pi_{i,j}$, the permute functions will change as a function of i. Therefore, $s_i$ provides sufficient diversity between stages.

Transmitted symbols are $X_{i,j}=\pi_{i,j}(m_i)$, where each $\pi_{i,j}$ is generated by a pseudo-random number generator that is seeded with $s_{i-1}$. The encoder produces symbols in passes, with the $j^{th}$ pass consisting of the sequence $(x_{1,j}, x_{2,j}, \ldots x_{n/j,k})$.

One possible way to generate a pseudo-random permutation from $s_i$ is by using several pseudo-random numbers derived from $s_i$. A k-bit block $m_i$ is loaded into an internal variable a, and updated several times: either a=a XOR r, a=a ROTL r, a=a+r(mod $2^k$), where r is a different pseudo-random number at each update. All of these transformations may be one-to-one and onto, so the result of the entire process is a one-to-one and onto function, i.e., a permutation. One-to-one and onto functions have the property that, for a given input, there is a unique output that is not produced from other inputs. In other words, there is a unique correlation between inputs and outputs. This is different from hash functions where two different inputs to the hash function may produce an identical output.

Using a one-to-one and onto function to produce the symbols X that are transmitted over the carrier channel can reduce decoder complexity, as will be discussed below.

An example implementation of a permute function is shown in Code Listing 1 below. Note that the function depends on j through the seed; a PRNG seeded with $s_{i-1}$ is repeatedly queried for seeds, returning a different seed for each j (this is not shown in the included code).

Another transformation that can be performed is a=p for some random permutation p. An example that only uses such a permutation and XOR is given in Code 2. Seeding each permutation with $s_{i-1}$, which depends on the previous k-bit blocks, is beneficial for the following reason. Given the permutations, one can assign a likelihood score to each k-bit combination, but decoding k-bit value separately is inefficient. Such a scheme will decode most blocks, but a small fraction will be erroneous; getting all blocks to decode requires excessive redundancy. To share error correction between blocks, permutations for block i are chosen based on all blocks 1; 2, . . . , i-1. Thus, when even one of the previous blocks is erroneous, all k-bit combinations will have low likelihood metrics.

Decoders for Permute Codes

Prefix Tree

The Permute decoder receives the transmitted message and traverses a message prefix tree, calculating node likelihoods. In particular, The prefix tree is a complete $2^k$-ary tree of possible values of $s_i$ tree rooted at $s_0$, where each of the $2^k$ branches between a node at layer i and its children at layer i+1 signifies some value for $m_{i+1}$.

Each layer of branches is associated with the likelihood of symbols derived from a k-bit block: the first layer of branches with symbols derived from $m_1$, the second layer with symbols derived from $m_2$, etc. Because the transmitted symbols $x_{i,j}$ are computed as xi; j=$\pi_{i,j}(m_i)$, so they are dependent on $m_i$ and on $s_{i-1}$ (through the choice of $\pi_{i,j}$). When computing the likelihood of a branch, both are available: $m_i$ is associated with the branch, and $s_{i-1}$ is determined by the prefix associated with the parent node of the edge in the prefix tree.

Low-Complexity Decoding

Efficient decoders explore a subset of the tree rather than the entire tree, be it via the M-algorithm, sequential decoding, or other means. A decoder typically keeps a set of nodes and updates the set iteratively: it chooses a subset of tree nodes from the set, evaluates the likelihoods of all children of the retained nodes, and keeps the most likely children. These most likely children become "candidates" for the state variable $s_{i-1}$ that the encoder used to produce the permute codes $\pi_{i,j}$. The decoder evaluates the candidates to determine the most likely value of $s_{i-1}$ used by the encoder.

The structure of permute codes allows the decoder to evaluate for each chosen node only a small fraction of its children, thus reducing the amount of resources required to decode. In an embodiment, the sender and receiver contain the same function and seeds for generating the permute codes so that the receiver, when decoding the message, can generate and use the permute codes that were generated and used by the sender.

When the SNR is high in an additive white Gaussian noise (AWGN) channel, only a small fraction of constellation points is possible. All other points have extremely low likelihood; for example, points farther than 3.3σ (i.e. 3.3 standard deviations) away have likelihood less than $10^{-3}$ and the likelihood is less than $10^{-6}$ at 4.96σ. Exploring constellation becomes exceedingly expensive and less fruitful the farther one gets from the received symbol. Thus, the decoder can include a predefined minimum probability for which nodes it will explore. If a node has a probability of use greater than the predefined minimum, then the decoder will retain and explore the node to determine if it was used by the encoder. If the node has a probability of use less than then predefined minimum, then the decoder may ignore that node in order to save time and processing resources. Additionally or alternatively, the decoder may choose a number N of the most probable nodes in the tree to explore and ignore the other nodes.

Figure 4:
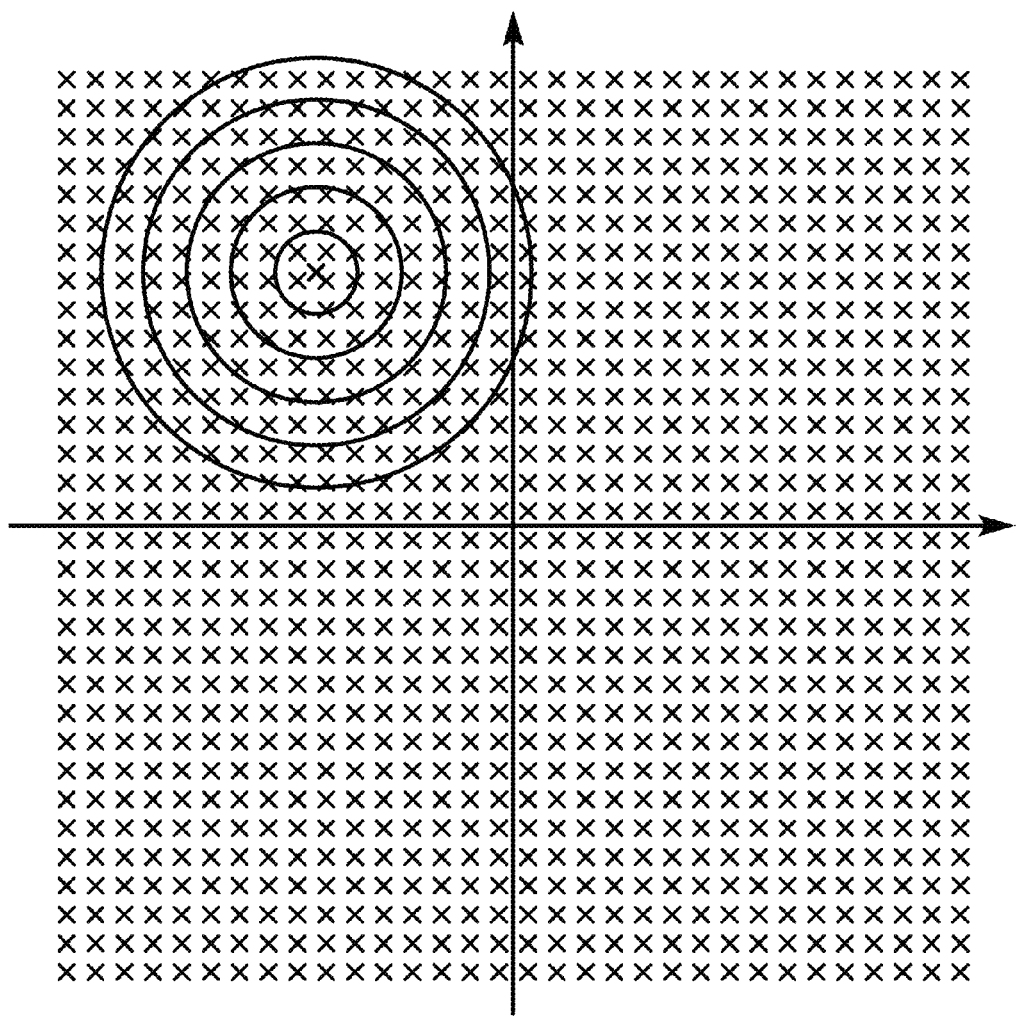
FIG. 4 is a QAM-1024 constellation map having high signal to noise (SNR) reception marked with a red X. Circles mark 1 σ to 5 σ of noise. Constellation points outside the outer circle occur with p<10-6.

FIG. 4 shows an example. In FIG. 4, all possible messages are mapped as constellations on a two-dimensional grid, shown by Xs. The message sequence received by the receiver is in the center of the circle. If the received message contains errors, then the received message may not be the same as the transmitted message, i.e. the actual transmitted message is a different X on the grid. Each of the rings represent a probability that the actual message X falls within the ring, with the inner rings representing a higher probability of containing the actual message and the outer rings representing a lower probability.

An efficient decoder should therefore explore only the branches corresponding to likely constellation points. Given a proposal for $s_{i-1}$, the decoder enumerates through the constellation points closest to the received symbol (i.e. up to a predetermined distance away, such as, for example, 5σ away), applies the inverse permutation to find the k-bit block, and associates with it the likelihood metric of the examined constellation point.

To implement a decoder that supports multiple passes, one has to specify how the decoder treats multiple symbols for a branch. One option, a so-called branch-select decoder, uses one of the received symbols to select which branches are explored, then uses the rest of the received symbols to calculate the full branch metrics of the selected branches. For the first symbol, for each explored constellation point, the decoder applies an inverse permutation to get the k-bit block. Then, for each of the rest of the symbols, it applies the forward permutation, and then compares the resulting constellation point with the received symbol.

For this process to have a small probability of failure, the explored perimeter needs to be relatively large: exploring only 3σ area around the received symbol leads to a failure probability of ≈$10^{-3}$. Because these probabilities compound as decoding progresses from layer to layer, the decoder must explore a much wider area.

Another option for decoding, a so-called cell-update decoder, maintains a table of likelihoods with a cell for each of the $2^k$ options. The decoder explores the constellation points around each received symbol. For each such point, it performs the inverse permutation to determine the corresponding k-bit block, and updates the appropriate cell in the likelihood table. This allows the exploration of each symbol to be much narrower, because the probability of more than one node having a low likelihood is extremely small. The narrow exploration makes this decoder type more economical, but when operating on symbols in parallel, care needs to be given to avoiding cell contention: the cell-update decoder operating on multiple symbols in parallel might try to update the likelihood of a cell with several likelihoods simultaneously.

Systematic Permute Codes

As mentioned above, channel diversity may be increased where $\pi_{i,j}$ is different for different j. Without loss of generality, however, one can set $\pi_{i,j}$=id where id is the identity.

Code listing 1 Permutes an 'nbit'-wide value 'val' by a pseudo-random permutation given by 'seed'

CODE LISTING 1

```
def     permute_rotate(seed, val, nbits):
    """
    Permutes 'val' using a pseudo-random permutation specified by
    'seed'.
    The permutation is of a space of 2^'nbits' (i.e., values of 'val' are
    have nbits)
    """
    NUM_ROUNDS = 6
    mask = (1 << nbits) - 1
    # Rotation function, rotates 'nbits'-long variables
    def rot(x,k):
        return (((x) << (k)) | ((x) >> (nbits-(k)))) & mask
    # rotation constants
    r = [ ]
    for i in xrange(NUM_ROUNDS):
        val ^= (seed & mask)
        seed >>= nbits
        val = ((seed & mask) - rot(val, r)) & mask
        seed >>= nbits
    return           val
```

Code listing 2 Permutes an 'nbit'-wide value 'val' using XOR and a random permutation 'perm' permutation (i.e. id(x)=x).

CODE LISTING 2

```
import     numpy
class      Permuter(object):
    def        __init__(self, nbits, num_rounds = 6):
        self.nbits = nbits
        self.num_rounds = num_rounds
        self.mask = (1 << nbits) - 1
        ## generate pseudo-random permutations:
        # first, get the pseudo-random number generator
        import wireless
                        rand =
                            wireless.MTRand(wireless.vectoru
                                i ( ))
        # Now generate permutation
        self.perm = numpy.empty(1 << nbits, dtype=numpy.uint16)
        self.perm = 0
        for i in xrange(1, 1 << nbits):
            j = rand.randInt(i)
            self.perm = self.perm
            self.perm = i
    def permute(self, seed, val):
        for i in xrange(self.num_rounds):
            # XOR the 'nbits' lowest bits of seed
```

CODE LISTING 2-continued

```
            val ^= (seed & self.mask)
            # throw away seed's lowest 'nbits' bits
            seed >>= self.nbits
            # Apply this round's permutation
            val = self.perm
    return val
```

The code has the property that $x_{i,1}=m_i$, making it a systematic code, i.e. an error-correcting code where the input is embedded in the encoded output. With systematic codes, a given output of the permute algorithm can be run backwards through the permute algorithm (or through an inverse permute algorithm) to produce the original input. For at least this reason, systematic codes are attractive when it comes to constructing iterative ensembles, as explained below. This differs from hash codes where different inputs to the hash function may create the same output, so given an output, there is no guaranteed way to produce the original input.

Systematic Spinal Codes

We note here that spinal codes can also be converted to a systematic code by transmitting the original message blocks in the first pass. Using the branch-select decoder, it is possible to explore a smaller amount of branches: the decoder looks at constellation points close to the received first-pass symbol. These points correspond to k-bit blocks. The decoder then calculates the spine value $s_i$ using $s_{i-1}$ and the k-bit block, then computes received symbol likelihoods given $s_i$ (this computation is similar to the standard spinal decoder). Using this method, the spinal decoder only explores branches whose first-pass constellation points are close to the received first-pass symbol, reducing the amount of work that needs to be done at high SNR.

Systematic spinal codes may preclude transmitting less than one pass via puncturing, a feat which is possible with the standard spinal code (for example, the standard spinal decoder can decode even with only symbols only from even i). This can be fixed by sending c bits of the message instead of k bits: bits 1 to c, then (k+1) to (k+c), then (k+c+1) to (k+2c), etc. (there is a c−k bit overlap). Since the k MSB bits of this c bit number are mi, the branch-select decoder can still work. If c is large enough (e.g., c≥2k), then a punctured pass suffices to decode the message completely when SNR is high.

Multi-k Codes

Permute codes work well when the density of the constellation mapping is suited to the SNR: there should be several likely constellation points within few standard deviations (σ) of the reception, so that the code conveys a large amount of information when momentary noise is low, reducing the number of likely constellation points, so the decoder only needs to explore a small number of points thereby keeping decoding complexity low. For a given k, therefore, a permute code works well over a narrow range of SNRs—e.g. the SNRs where its constellation density is appropriate to the channels.

With only fixed-k codes, the system needs to estimate the channel and pick a suitable k before beginning transmission. If the noise is different than the estimate, the code is less efficient—either has low throughput or high computational cost to find the transmitted message. It is therefore desirable to construct a single code that works well over a wide range of SNRs.

Multi-k permute codes work by having multiple encoders of the same message with different k. The first symbols are produced from a high-k encoder, so in case the SNR is high, the code has high throughput. The code then moves to lower and lower k's as it becomes apparent that the SNR is lower than previously anticipated, enabling lower decoder complexity and/or fewer decoder operations.

The decoder traverses the prefix tree like a regular permute code, but keeps track of the $s_i$'s of all different encoders. Different layers in the tree now have different degrees. Say a k=4 code is combined with a k=3 code. The first code will have symbols relating to prefixes of 4, 8, 12, 16 . . . , the second symbols from prefixes of 3; 6; 9; 12; 15 . . . . The joint prefix tree will have nodes corresponding to prefixes 3; 4; 6; 8; 9; 12; 15; 16 . . . . When the decoder is at some layer, it can choose whether to use the brute-force, branch-select, or cell-update decoders, according to which one has the lowest cost.

Figure 5:
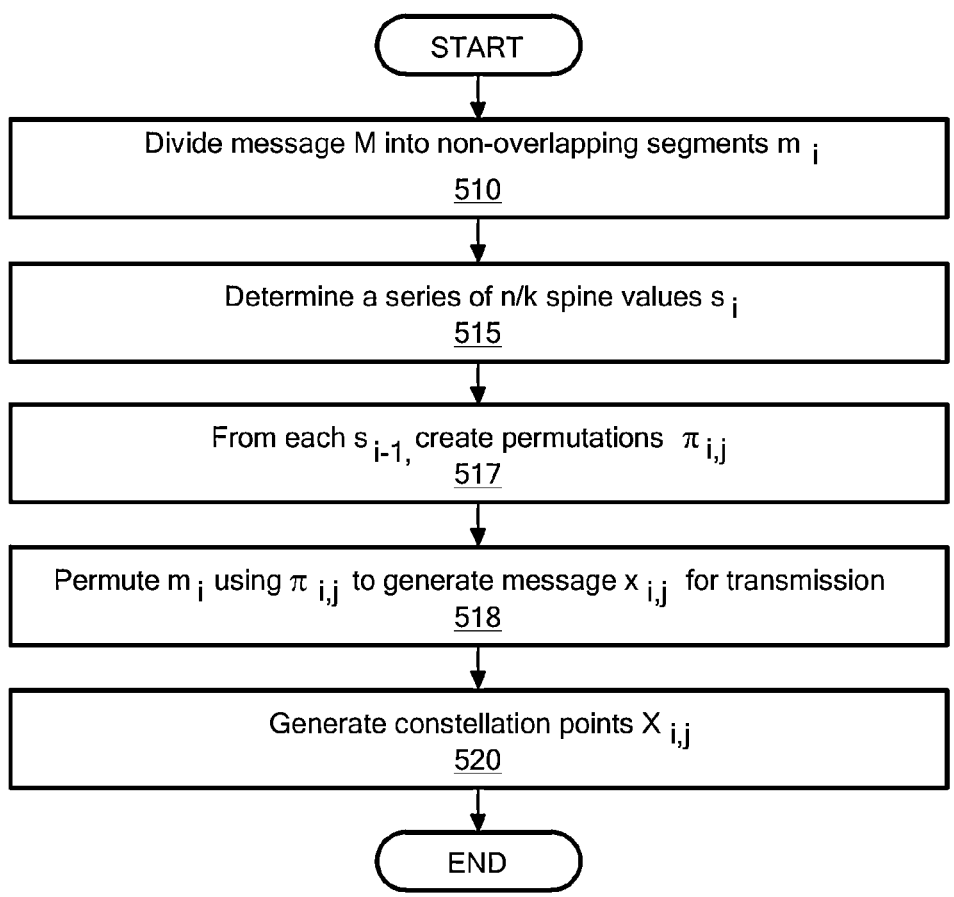
FIG. 5 is a flow diagram of an encoding process.

Referring to FIG. 5, a process 500 for encoding may be implemented by an encoder, such as encoder 232. The encoder 232 takes a message block $M=m_1, \ldots, m_n$ as input and generates a possibly infinite stream of constellation points or symbols, where n is an integer greater than zero. To do so, the encoder 232 makes passes over the spine of the code, which is generated in the first pass. In particular, for the first pass, the process 500 divides the message M into non-overlapping segments of size k bits each where k is an integer greater than zero (510). Thus, $M=M_1, M_2, \ldots, M_{n/k}$ with $M_t = m_{tk+1} m_{tk+2} \ldots, m_{(t+1)k} \in \{0,1\}^k$ for $1 \leq t \leq n/k$. Process 500 determines a series of n/k spine values, where: $s_t = h(s_{t-1}, M_t)$, with $s_0 = 0$ (515).

For each spine value $s_{i-1}$, process 500 generates permute codes $\pi_{i,j}$ (517). Process 500 then uses the permute codes to permute the k-bit blocks $m_i$ to generate messages $x_{i,j}$ for transmission (518). One skilled in the art will recognize that permute codes $\pi_{i,j}$ for a given encoder pass j may be generated iteratively on each pass of the encoder, or may be generated all at once or in batches. Process 500 generates constellation points by making one or more passes over each spine value (520). For example, in each pass, the encoder 232 generates n/k new constellation points. In the $l^{th}$ pass ($l \geq 1$), encoder generates the $t^{th}$ constellation point as follows ($1 \leq t \leq n/k$):

1. Let the infinite precision bit representation of $s_t$ be $b_1 b_2 b_3 \ldots$.

2. Let $b'_1, \ldots, b'_{2C}$ denote the 2C bits in the representation of $s_t$ starting from position 2C(l−1): for l=1, it is $b_1, \ldots, b_{2C}$; for l=2, it is $b_{bC+1}, \ldots, b_{4C}$ and in general it is $b_{2C(l-1)+1}, \ldots, b_{2Cl}$.

3. Use the constellation mapping function, $f$, to map $b'_1, \ldots, b'_{2C}$ to a constellation point.

This constellation point is transmitted over the transmission link. This corresponds to an example where $H_i$ returns bits i2C+1, . . . (i+2)2C of the spine value.

In another example for process block 520, let g(s, r) be a hash function whose inputs are a spine value s and a salt r. In order to generate n/k new constellation points in pass i, coded bits are obtained by evaluating g(s, i). Then the constellation mapping function $f$ is used. In this example, $H_i(s)=g(s, i)$.

Illustratively, there are many possible constellation mappings. In one example of a linear mapping, 2C bits are taken and the first C bits are considered as the I part and the last C bits as the Q part. The I (resp. Q) coordinate mapped to the range is:

$$(b'_1 \ldots b'_C) \to (-1)^{b'_1} \frac{(b'_2 \ldots b'_C)}{2^{C-1}-1} \cdot P^* \quad (3)$$

In other words, a symbol $x \in \{0, \ldots, 2^C-1\}$ linearly onto (−P, P) where P is a constant derived from the power constraint. This is the value of either the I or Q axis. The formula is a linear mapping.

$$x \to \left(x \frac{1}{2^C-1} - \frac{1}{2}\right) \cdot P.$$

Notably, the encoder described above generates $t^{th}$ constellation point/symbol in the $l^{th}$ pass by taking 2C bits of the spine value $s_t$, distinct from those used to generate any other constellation point. Since the spine value may be generated by a hash function, from property (i) of the hash function each non-overlapping sequence of 2C bits is equivalent to a distinct hash function that produces a 2C-bit number. Therefore, an illustrative abstraction for the encoder 232 is as follows. First, the encoder generates n/k spine values $s_t$, $1 \leq t \leq n/k$ using a hash function h. In the $l^{th}$ pass, it uses a distinct hash function $h_l: (0, 1) \to \{0, 1\}^{2C}$ to generate constellation points. Specifically, the encoder generates the $t^{th}$ constellation point in the $l^{th}$ pass by applying constellation map to the 2C bits produced as a result of $h_l(s_t)$.

Figure 5A:
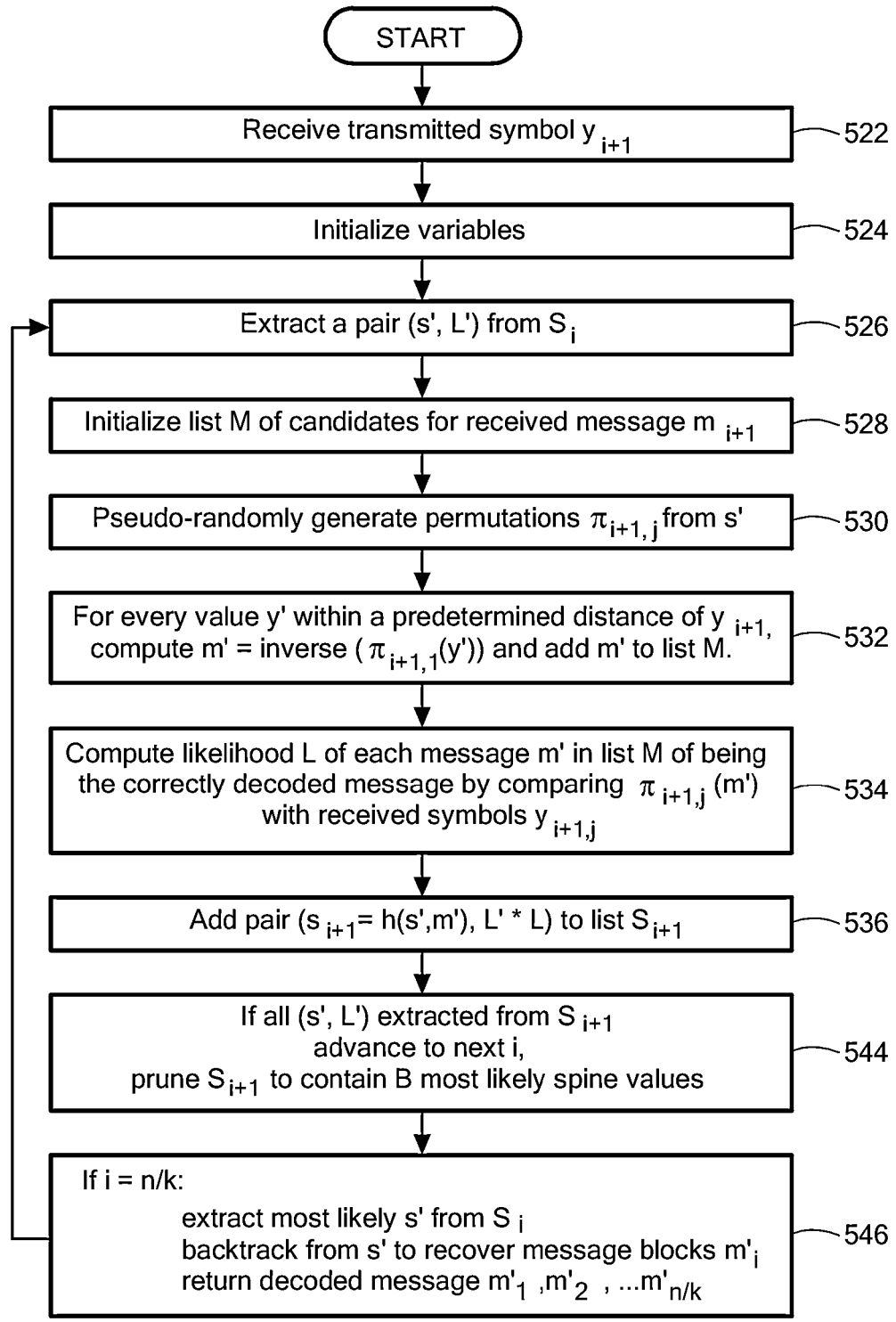
FIG. 5A is a flow diagram of a decoding process.

Referring to FIG. 5A, a process 500A may be used by a decoder, such as decoder 234, to extract messages from an encoded transmission. Decoder 234 first receives one or more transmitted symbols $y_{i+1}$ from a transmitter device (522). As noted above, noise in the transmission channel may interfere with the transmission so that the received symbol y, may not be the same as the transmitted symbol $x_i$. The decoder may then initialize variables for the decoding process. For example, the decoder may create an empty list $S_{i+1}$ to hold candidates for spinal values, an empty list M to hold candidates for decoded k-bit blocks $m_i$, as well as other variables that can be used during the decoding process.

Decoder 234 may then extract a pair (s', L') from the list of spinal values $S_i$ (526). If this is the first iteration of the decoding process, Si may simply contain $s_0$, as described above. Otherwise, $S_i$ may contain spinal value pairs populated during decoding of a previous k-bit block. The spinal value pairs comprise a candidate spinal value s', and a likelihood L' that the spinal value s' is the value that was used by the encoder to encode the current symbol.

The decoder may then initialize a list M of candidates for the decoded k-bit blocks $m_i$ (528), and pseudo-randomly generate permute codes $\pi_{i+1,j}$ from s' (530). As noted above, the encoder and the decoder may use the same pseudo-random number generator so that, assuming that s' is the spinal value that was used by the encoder, both the encoder and decoder will produce the same permute codes from s'.

The received symbol $y_{i+1}$ can be mapped on an I-Q map as shown in FIG. 4. Thus, for every value y' within a predetermined distance of $y_{i+1}$ on the map, decoder 234 may compute m' by running y' backward through the permute function (532), for example:

$$m' = [\pi_{i+1,j}(y')]$$

As noted above, because permute codes are systematic codes, performing the inverse of the permute function on y' will produce m'. This is different from traditional spinal codes that use a non-systematic hash function where different inputs can create the same output, so that the inverse of the hash function on a received symbol will not necessarily yield the k-bit block used to produce the symbol. Decoder 234 then adds each m' to the list M.

For every m' in the list M, decoder 234 may compute a likelihood L that the message m' is the correctly decoded message by comparing the permutation $\pi_{i+1,j}(m')$ with the received symbols $y_{i+1}$ (534).

Once the likelihood L is computed, the decoder 234 computes the next spinal value $s_{i+1}$ and adds it to list of spinal codes $S_{i+1}$, along with the likelihood L that the spinal value $s_{i+1}$ is the one used by the encoder (536). In an embodiment, the spinal value/likelihood pair placed in list $S_{i+1}$ is as follows:

$$[(s_{i+1}=h(s',m')),(L*L')]$$

When the decoder begins decoding received symbol $y_{i+2}$, these spinal values that are now placed in list $S_{i+1}$ will be used.

If all the spinal value pairs have been extracted from the current list Si, the decoder will advance to the next i to begin decoding the next received symbol $y_{i+2}$ (544). The decoder will also prune the list Si to contain only the B most likely spine values (i.e. the spine values with the highest likelihood L), where B is a predetermined number of spine values to be retained.

If i=n/k (i.e. if the last k-bit block has been decoded), then the decoder will extract the most likely spine value s' from the list Si and use it to backtrack and recover the most likely k-bit blocks m' (546) and assemble them into a decoded message m' 1, m'2, ... m'n/k. If i≠n/k, the decoder will advance to block (526), extract the next pair (s', L') from $S_i$, and continue the decoding process.

Properties of the Encoding

In the embodiment described above, the receiver obtains symbols corresponding to an integral number of passes. In this case, the achievable rates are $R_{max}$, $R_{max}/2$, $R_{max}/3$, ... $R_{max}/l$, ..., a harmonic sequence.

In fact, other rates are achievable using the classic idea of puncturing. In particular, each pass provides a stronger opportunity for the decoder to overcome noise. However, this process can be wasteful if the pass is very long, since only a little information might have been missing, and the pass provides an excess of information. Therefore, we can puncture the passes to get better granularity of handling noise.

In the permute code context, an illustrative puncturing may occur as follows. In the first pass, the sender transmits a symbol for every value in the spine sequence. In any subsequent pass, the sender can choose to transmit only every $g^{th}$ value, where g may change from pass to pass. For example, one option is to use the schedule (8, 4, 2, 1). That is, the first punctured pass sends every $8^{th}$ value, the second pass sends every $4^{th}$ value but only if it is not a multiple of 8, the third pass sends every second value but only if it is not a multiple of 4, the fourth pass sends every value but only if it is not a multiple of 2, repeating this cycle as long as necessary. The rates are now more continuous than the harmonic progression of the non-punctured schedule; they work out to $R_{max}$, 8/9 $R_{max}$, 8/10 $R_{max}$, 8/12 $R_{max}$, $R_{max}/2$, .... According to one or more embodiments herein, therefore, this puncturing schedule may be used to achieve finer-grained control over the achievable rates.

Results

Some preliminary results follow. The parameter 'a' reported in permute experiments is the number of constellation points around the received symbol to explore. It is set to a high value in these experiments so that a fair comparison to spinal codes can be made.

Figure 6:
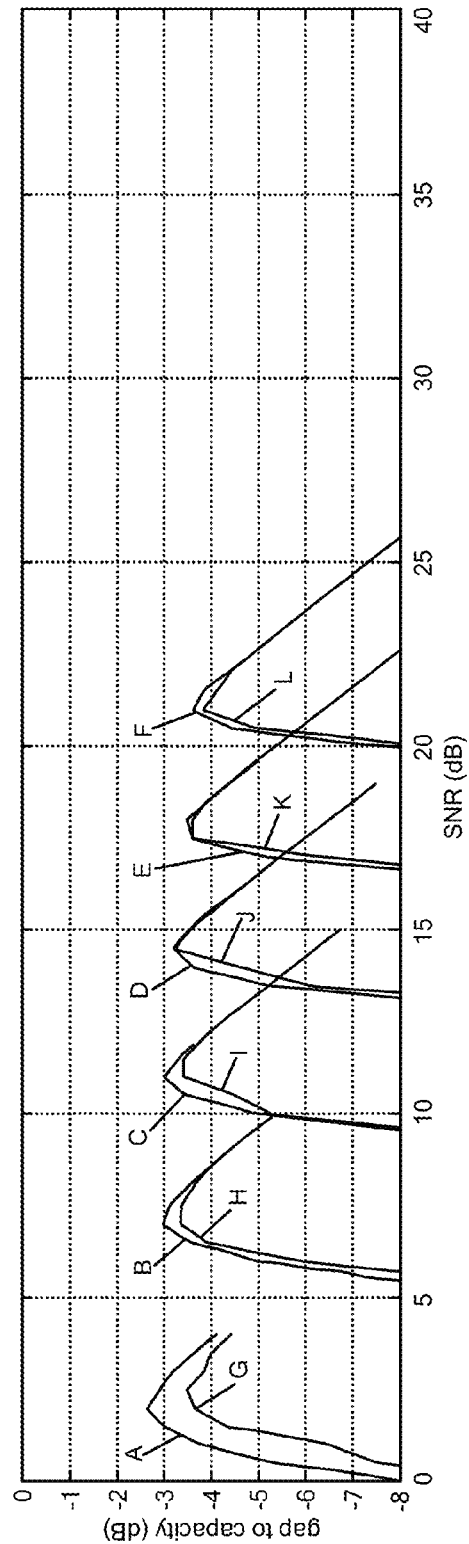
FIG. 6 is a plot of gap to capacity vs. SNR which illustrates a comparison of gap to capacity between permute and spinal codes over a range of SNRs.
Figure 7:
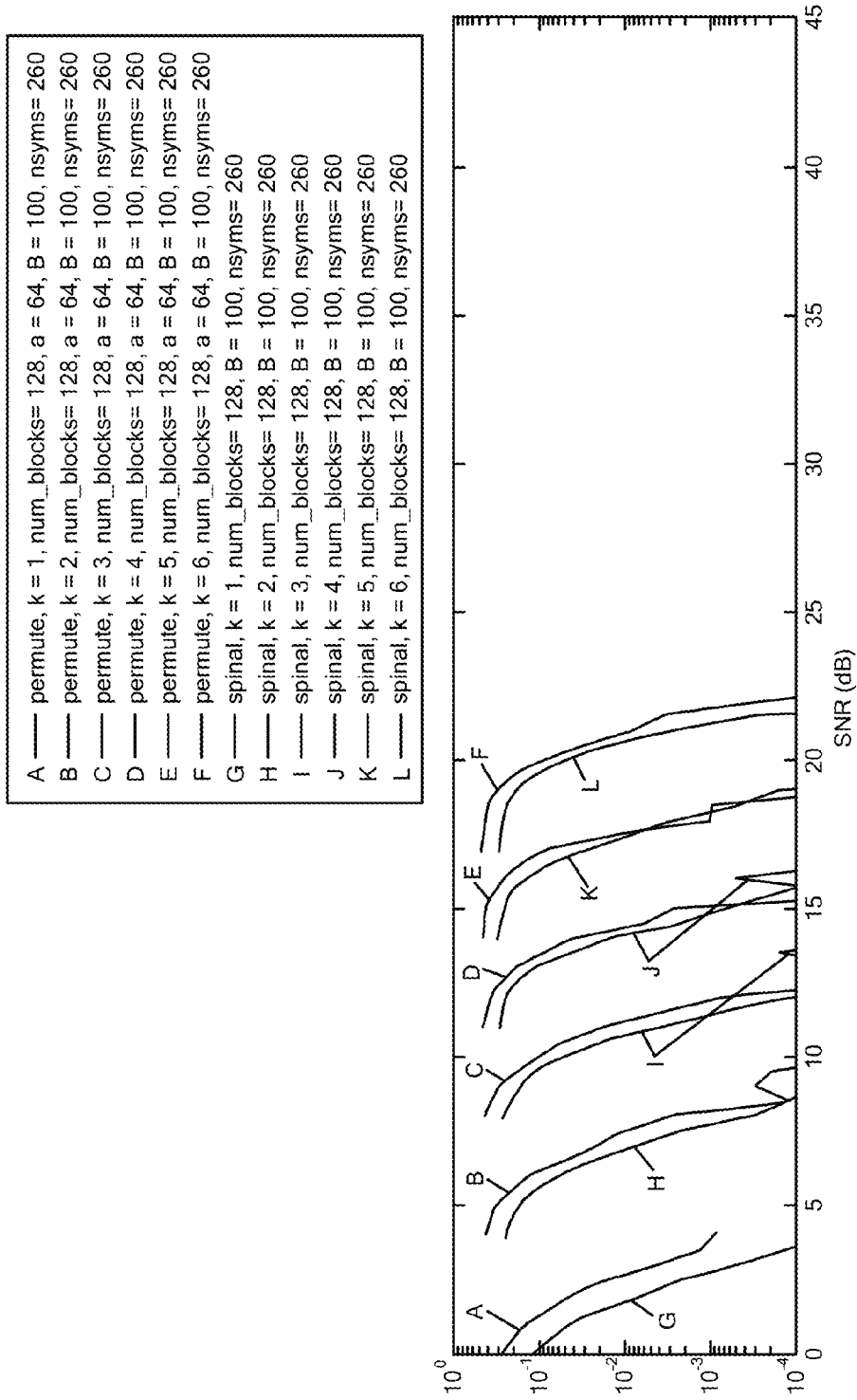
FIG. 7 is a plot of Bit Error Rate (BER) vs. SNR which illustrates a comparison of BER between permute and spinal codes over a range of SNRs.
Figure 8:
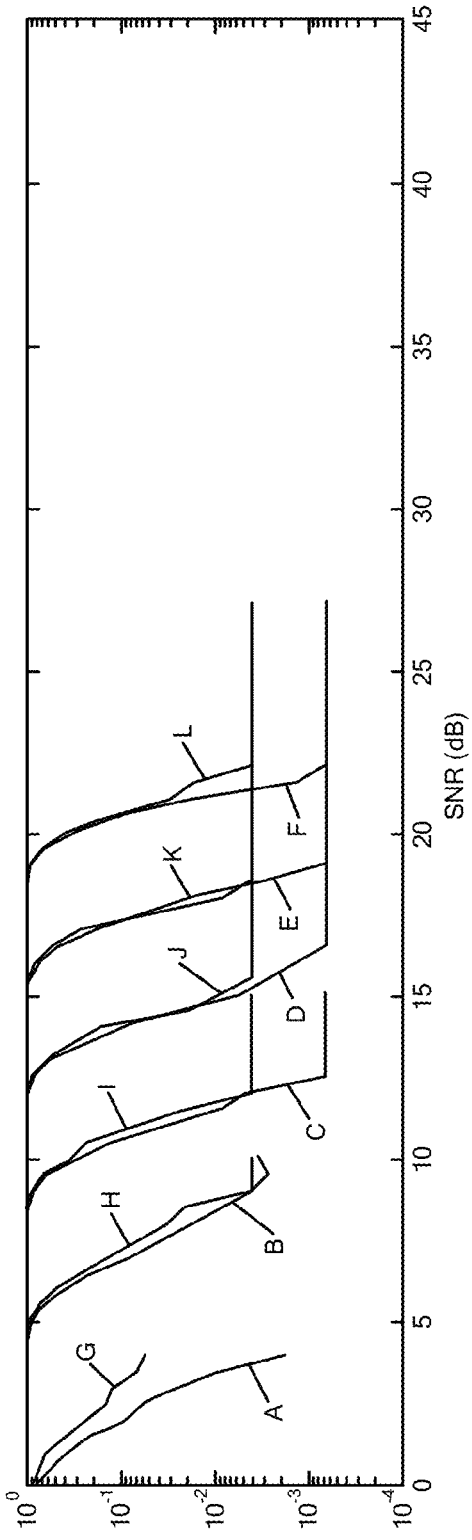
FIG. 8 is a plot of Packet Error Rate (PER) vs. SNR which illustrates a comparison of PER between permute and spinal codes over a range of SNRs.

FIGS. 6, 7, and 8 compare the gap to capacity, bit error rate (BER) and packet error rate (PER) of permute codes with spinal codes. Permute codes achieve higher rates (throughput) by a few tenths of dB up to almost 1 dB at low SNR. All instances of permute codes have lower BER than the corresponding spinal codes at every SNR, and their waterfall region appears at lower SNR. Results for PER are less conclusive because we have not yet run a large enough number of experiments, but seem to match the BER results.

Figure 9:
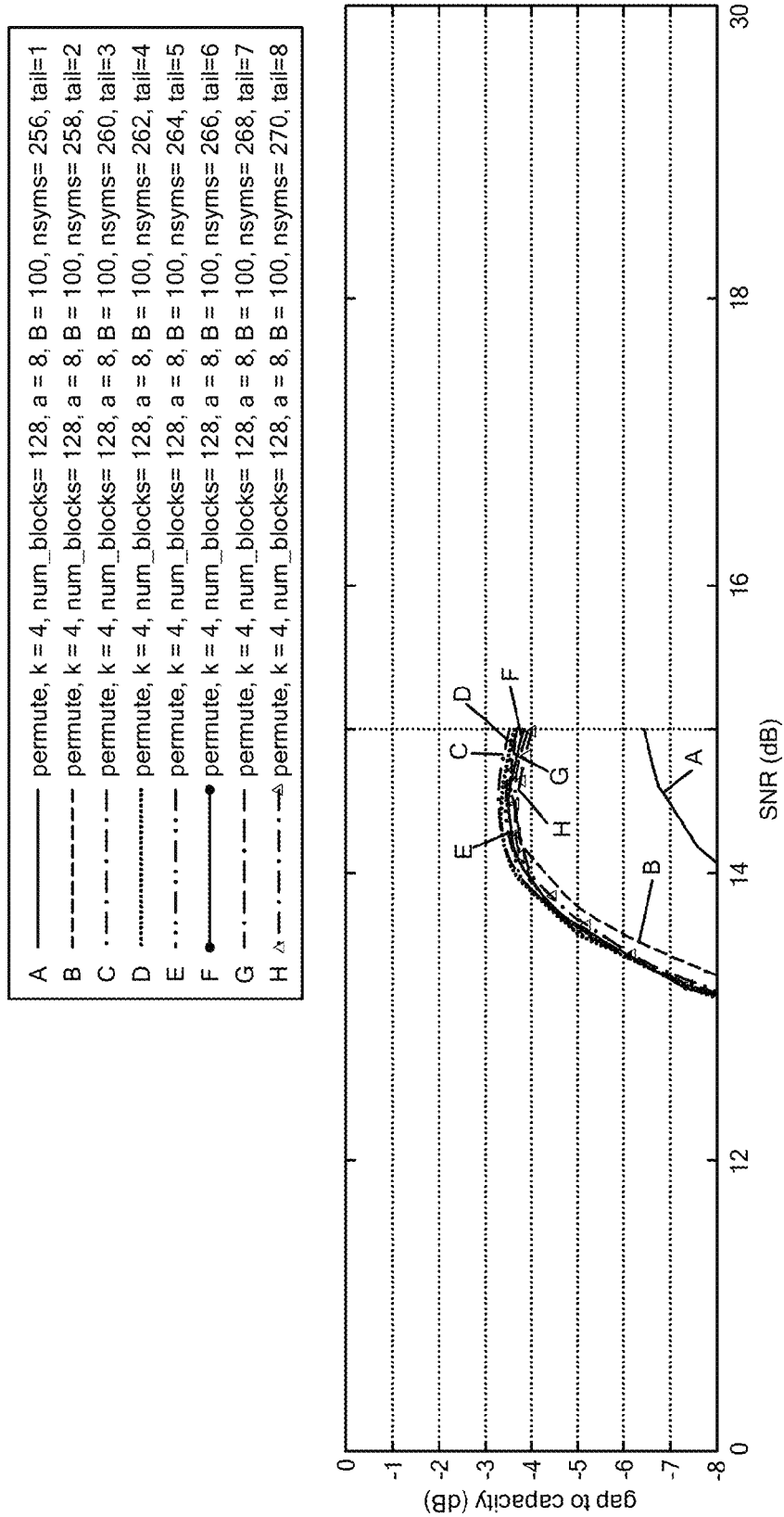
FIG. 9 is a plot of gap to capacity v. SNR of different amounts of tail symbols.
Figure 10:
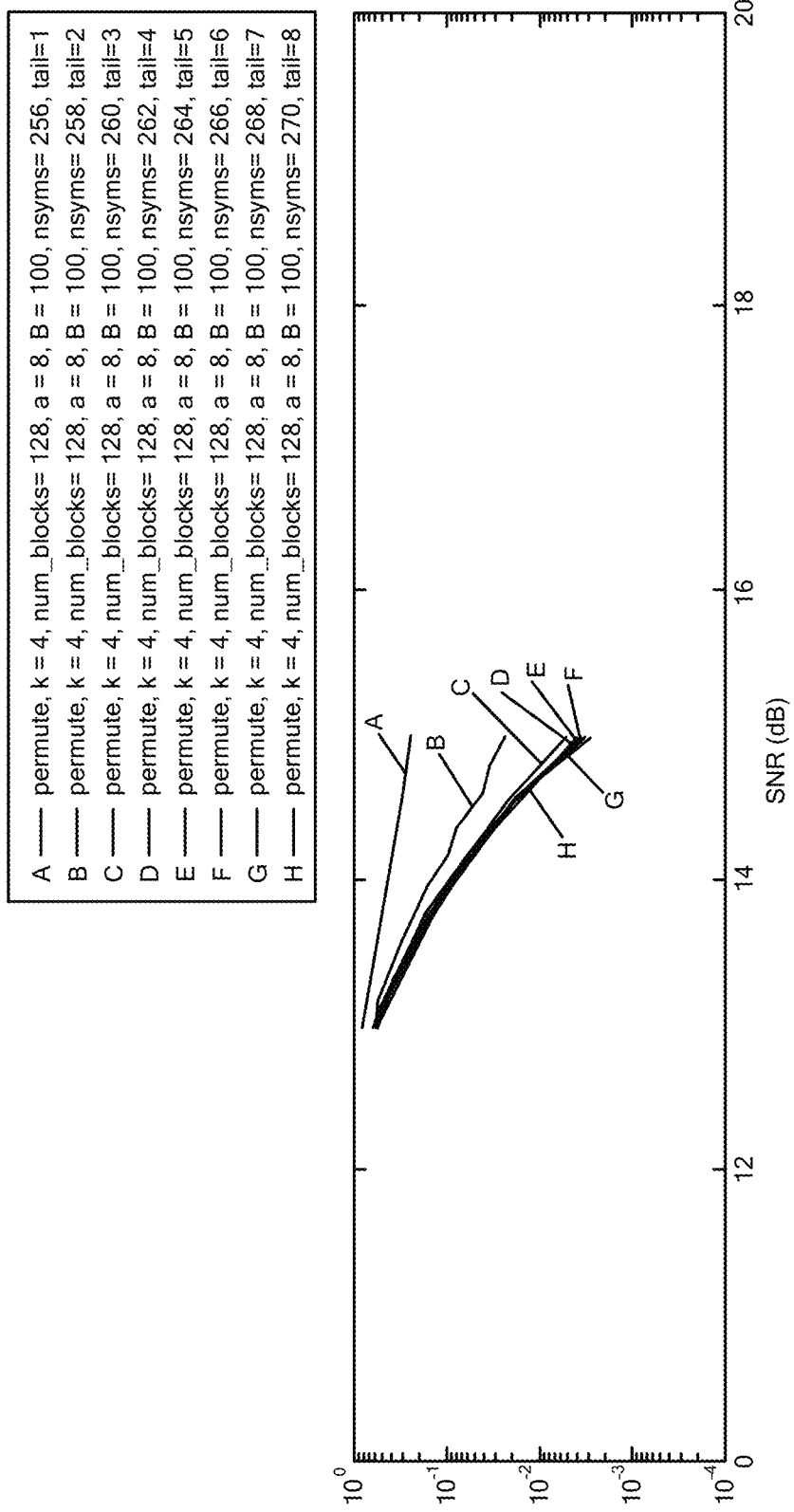
FIG. 10 is a plot of gap to capacity v. SNR of different amounts of tail symbols.

FIGS. 9 and 10 show a choice of tail symbols for a particular instance of permute codes.

Figure 11:
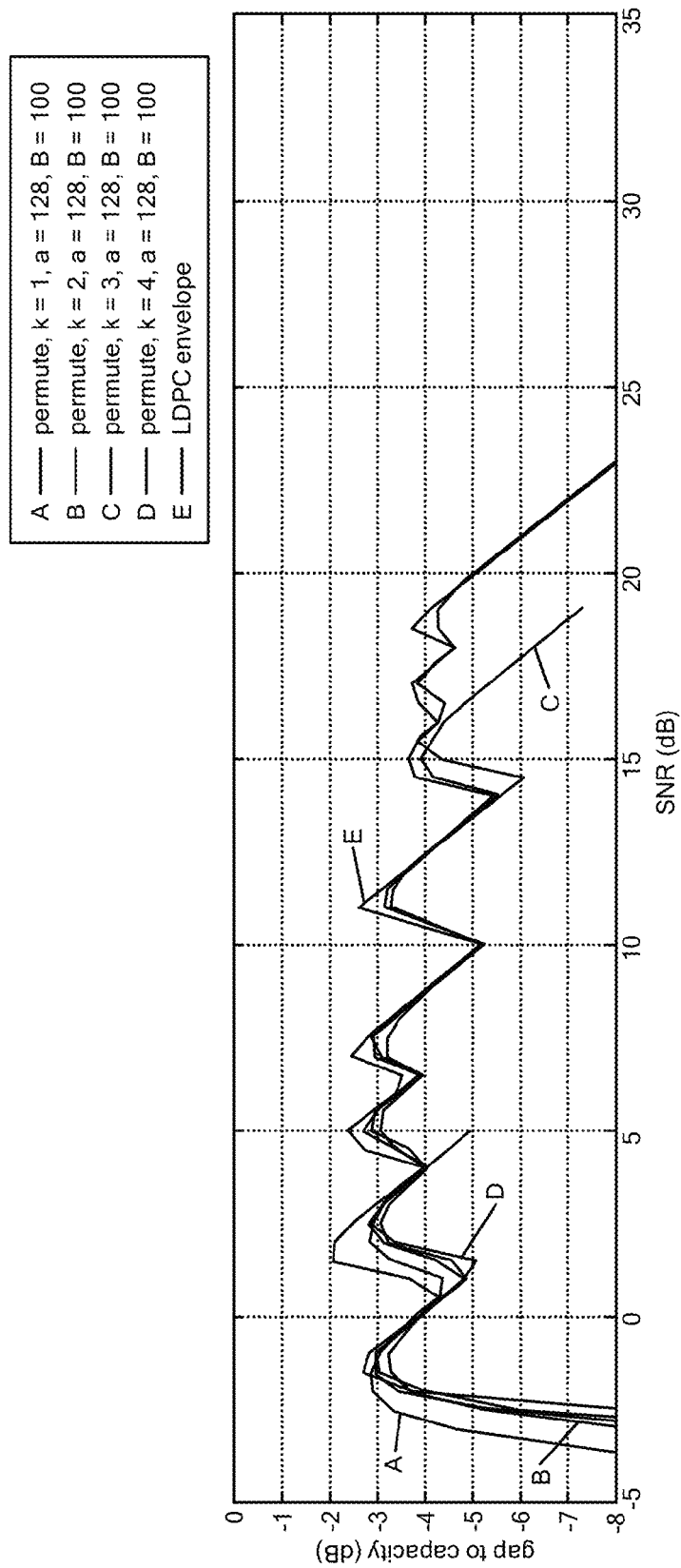
FIG. 11 is a plot of gap to capacity vs. SNR which illustrates a comparison of relatively low-cost (B=100) permute codes to 802.11n LDPC.
Figure 12:
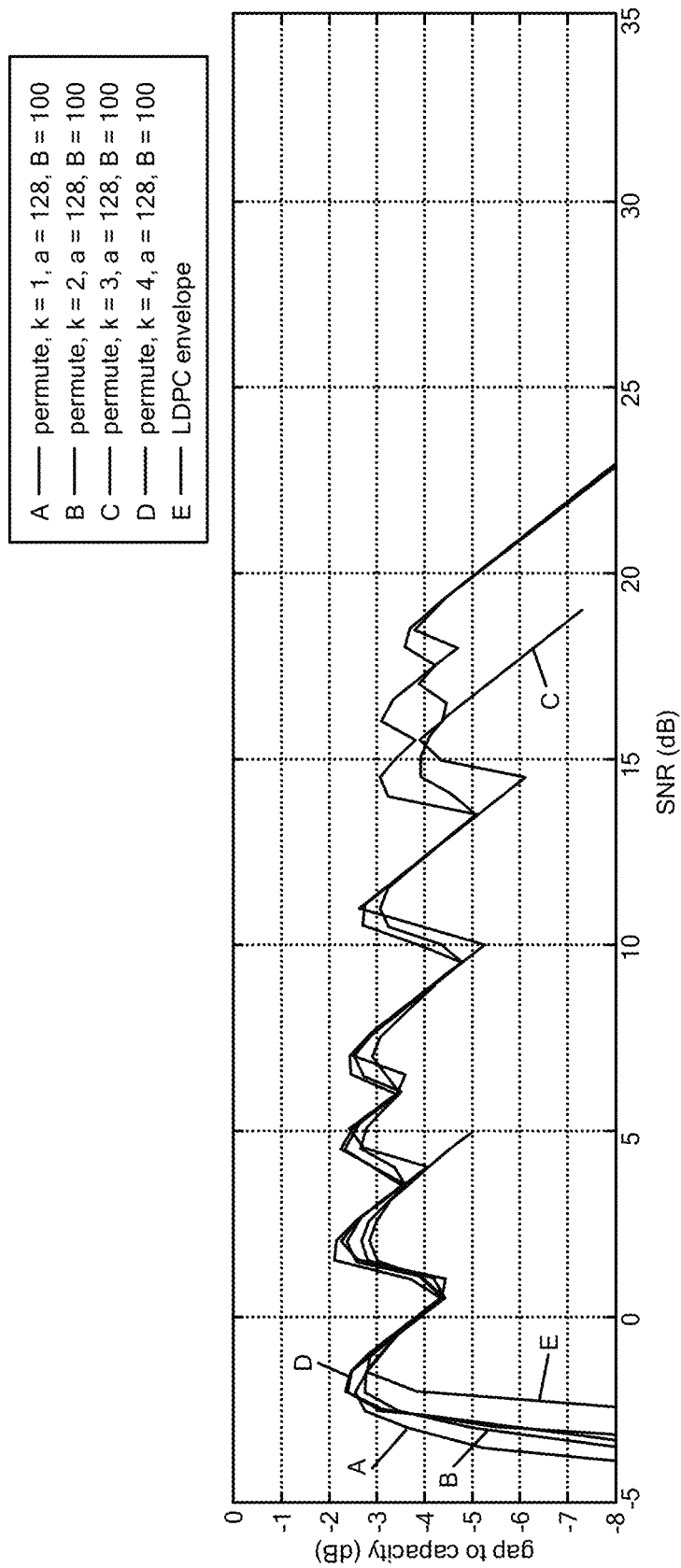
FIG. 12 is a plot of gap to capacity vs. SNR which illustrates a comparison of relatively high-cost (B=1000) permute codes to 802.11n LDPC.

FIGS. 11 and 12 compare 802.11n LDPCs to permute cost with B=100, and B=1000 correspondingly. The lower-end code doesn't outperform LDPC except isolated cases. The higher-end code mostly performs as well and sometimes a few tenths of a dB better than the LDPCs, and in several cases manages to decode with 1-3 dB lower SNR (for example, around 3 dB, 10 dB, and 15 dB).

Iterative Ensembles

Iterative ensembles are constructions where multiple encoders share message bits; the decoders then pass likelihoods iteratively. This process allows the codes participating in the ensemble to individually operate at their best "bang for the buck"; i.e., decode errors happen, but few channel usages are needed. The exchange of information pushes participating members to a perfect decoding.

Turbo codes are an ensemble of two (systematic) convolutional encoders that encode two re-orderings of the message bits. Two MAP-decoders work in tandem, output likelihoods from one serving as input to the other.

Systematic codes are attractive for iterative ensembles because the systematic part can be used by multiple decoders and need only be transmitted once.

The systematic permute and spinal codes can also be used in an iterative ensemble, but a turbo-like construction would be sub-optimal, because the permute/spinal mode of failure is different. MAP-convolutional decoders offer helpful information on most of the bits and can use all information given to them. In contrast, permute and spinal codes do not allow for spurious bit errors—once a bit is decoded erroneously, subsequent bits will be pseudo-random, so the most useful information relates to early bits. After the code fails, it may be difficult to use future information to recover. These properties preclude random shuffling as an effective mechanism: shuffling randomly spreads the early bits of one encoder over the entire packet of the other, where they are unlikely to be useful.

Certain schemes use a property of the beam-search pruning strategy. Suppose the decoding algorithm has finished processing layer i of the tree. Looking at all unpruned nodes, they tend to all descend from very few ancestors. Looking farther up the tree provides sharper guarantees on what the true ancestors are. Take an example decoder with B=256 that finished processing layer 38. There are 256 nodes in the beam at layer 38, but these might, for example, only have 55 distinct ancestors at layer 35, only 7 ancestors at layer 33, and all nodes might share a single ancestor at layer 30. This example reflects a common general occurrence. Two decoders can then encode the same k-bit block. If one decoder suffers a large noise burst on this k-bit block which causes it to fail, the other decoder can help it recover: the second decoder runs for several layers forward, until it has good information about its ancestors (thus the k-bit block). This information is then supplied to the failed decoder, which now has enough information to recover this k-bit block correctly.

The number of layers to look back is influenced by a tradeoff; on the one hand, the farther back in the tree one looks, the information supplied becomes more pronounced and the more likely it is that the decoder can correctly decode the message. However, the helping decoder can also fail, and its failure probability increases the farther it has to run. Thus, a balance has to be struck between danger of failure, and power of correction.

Figure 13:
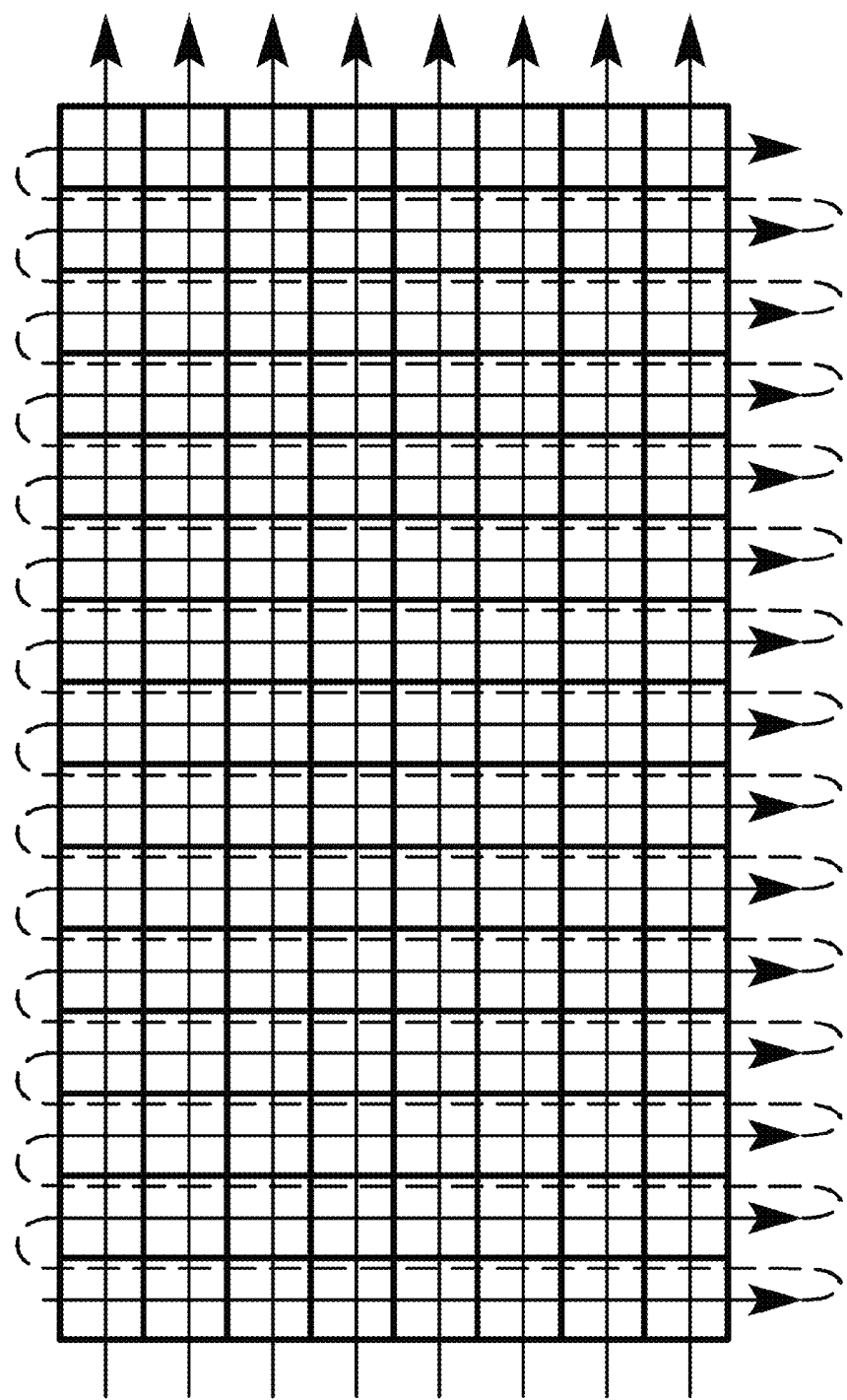
FIG. 13 is a block diagram of a weave ensemble illustrating row encoders (in blue) and a shuttle encoder (in red).

FIG. 13 shows the weave ensemble. A message is divided into a k-bit blocks (squares in the figure), which are arranged into a matrix. The row encoders each encodes a row from left to right separately from the other encoders (in blue). The shuttle encoder encodes all the blocks by column, from left to right. The two types work in tandem: the row encoders correct failures to the shuttle encoder, and vice versa.

Note that correction involves re-running some of the decoders. Suppose the shuttle decoder is used to correct the row decoders (the shuttle decoder runs ahead and supplies information to the row decoders). Assume a failure occurs in the shuttle decoder (potentially detected by observing mismatches between row decoder state and shuttle decoder state). To correct the failure, the shuttle decoder pauses while the row decoders run forward to provide likely ancestors at the point of the shuttle failure. After the error is corrected, the shuttle can continue to correct errors in the row decoders. This involves the row decoders that failed during the forward run to revert so they can benefit from correcting information from the shuttle decoder.

Graphical Hash Codes

One property of spinal and permute codes is that they are both sequential. At each layer explored by the tree there is a small probability of failure, and this failure event impacts the whole message. These failure probabilities compound to significantly reduce the performance of the code. In §2 we saw one solution plan, connecting several sequential structures to reduce their chance of error.

Another approach is to have a different dependency structure between transmitted symbols and message bits. Graph structures, like LDPC, provide a simple, flexible framework for specifying such codes. We want to keep good properties from spinal and permute codes:

1. Rateless coding. These codes can produce a stream of symbols, and decode efficiently given any number of symbols, thus adapting seamlessly to channel conditions. (Of course, they admit rated versions as well.)

2. Euclidean-distance likelihood computation. Received symbols are used directly in likelihood computations; by avoiding demapping to individual bit likelihoods, more information on transmitted bits is retained.

Encoder for Graphical Hash Codes

The code is specified by its check nodes: which message bits are incorporated into each check node. A check node incorporating d message bits can produce a stream of symbols derived from these d bits, as many as are requested, in a rateless manner.

We mark the $j^{th}$ symbol produced from check node i with $x_{i,j}$. In one of our implementations, $x_{i,j}=h(i; j; m_i)$, i.e. the symbols are produced from a hash of the message bits with I and j. A premute-like implementation will set $x_{i,j}=\pi_{i,j}(m_i)$ where $\pi_{i,j}$ is a pseudo-random permutation derived from i and j.

Decoder for Graphical Hash Codes

The decoder performs belief propagation in order to recover the original message bits.

One advantage of graphical hash decoders is that they can trade off memory with computation. Each check node keeps a table of likelihoods imposed by received symbols. A d-degree check node keeps $2^d$ likelihoods, a cell for each d-bit combination.

When a symbol is received, the check node produces all $2^d$ possible transmitted symbols, compares them to the reception, and updates likelihoods. Keeping these likelihoods saves the node from recomputing likelihoods in every belief propagation iteration. Computing likelihoods from l received symbols takes $O(l\, 2^d)$ time. With the likelihood table, the l factor is removed.

Bit-Likelihood Decoder

In the bit-likelihood decoder, there is one variable node per bit, and the passed messages are single bit likelihoods. Variable node messages are computed like in LDPC. We now specify the check node message computation method.

Suppose a check node is connected to variables 1; 2; ...; d, and the likelihood of string $b_1 b_2 \ldots b_d$ is $L(b_1 b_2 \ldots b_d)$. Incoming messages are $p_{i;0}$ and $p_{i;1}$, conveying likelihood of variable i being 0 or 1, correspondingly. We compute $p_{d;0}$ and $p_{d;1}$:

$$Pd, 0 = \sum_{b_1 b_2 \ldots b_{d-1}} L(b_1 b_2 \ldots b_{d-1} 0) \prod_{i=1}^{d-1} P_i b_i$$

$$Pd, 1 = \sum_{b_1 b_2 \ldots b_{d-1}} L(b_1 b_2 \ldots b_{d-1} 1) \prod_{i=1}^{d-1} P_i b_i$$

Note that this can be converted to use Log Likelihood Ratios (LLR). It is also possible to traverse the possible $b_1 b_2 \ldots b_{d-1}$ combinations in such an order that the product becomes cheaper—by traversing the combinations in Gray code order, the difference in the product is a single switch from $P_{i,\bar{b}_i}$ for some i. When dealing with LLRs, this is a single subtraction or addition.

The strength of this approach may lie in this update mechanism. Even if the messages provide no information for some of the bits, excellent beliefs can be derived from the likelihood table given some few bits of information. For example say the check node has 5 inputs. The noise on the medium allows 3 bits to be decoded, but not 5, for example. If good information is passed in messages from at least two of the 5 bits, the check node will supply good information at the output.

Compare this behavior with linear codes: if even one input bit lacks information, the check node does not provide information for any of the nodes.

Multibit-Likelihood Decoder

It is possible for variable nodes to represent more than one bit. All message bits are divided between variable nodes (not necessarily evenly). Check nodes either incorporate all or none of the message bits from a variable node. The belief propagation messages now carry richer information: 2k likelihoods for k-bit variable nodes.

Topology

Irregularity

A graph with all nodes having high degree might have difficulty converging, since all nodes pass messages that are indeterminate, and add some noise to the process. It might therefore be adventageous to have some nodes with either low degree or more symbols than others, so these nodes can bootstrap the belief propagation process. An irregular topology can provide this setting.

Origin of Ratelessness

One can envision a range of encoder graph topologies. In one extreme, the topology is fixed, with a bounded number of check nodes with pre-determined links. The encoder produces symbols from these check nodes in some order, using ratelessness of each check node. On the other extreme, the topology specifies an infinite sequence of check nodes (like Raptor codes). The encoder never produces two symbols from the same check node; it instead uses the next unused check node in the sequence to compute a symbol.

Hybrid Hash-Linear Codes

Hash check nodes are limited in degree by the computation required to compute belief messages. Some topologies (e.g., raptor) require a small amount of moderate- to large-degree nodes. These are important for aiding recovery of the last few undecoded bits in the decode process. If a topology is needed with such large degrees, it is possible to include linear check nodes together with hash check nodes. The symbols destined to the linear check nodes are de-mapped, and linear message computation is used (like in LDPC).

Puncturing Optimization

The puncturing schedule for spinal and permute codes specifies which is chosen at each point in the transmission. This not only controls omission of some symbols early on, but also emphasis of some i's over others, such as in the case of tail symbols.

The choice of a good puncturing schedule has an important impact on code performance: as the decoder can fail at each stage of decoding, allocating the right amount of symbols for each i is crucial for minimizing the overall chance of failure. The original spinal code paper identified tail symbols as greatly enhancing throughput, but there was no conclusion to what an optimal schedule would be.

Figure 14:
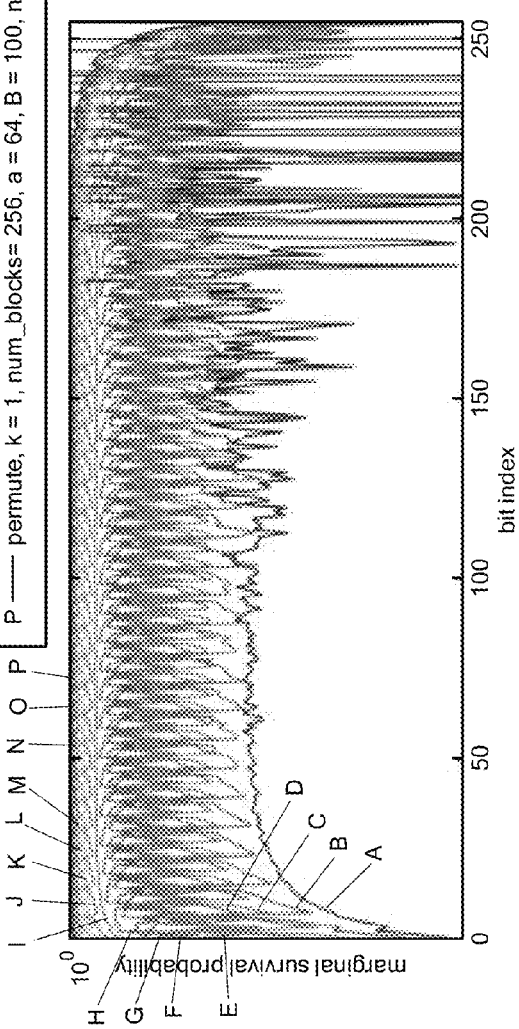
FIG. 14 is a plot of marginal survival probability vs. bit index for blocks of 1 bit. Y axis between 0.9 and 1.106 packets per line.
Figure 15:
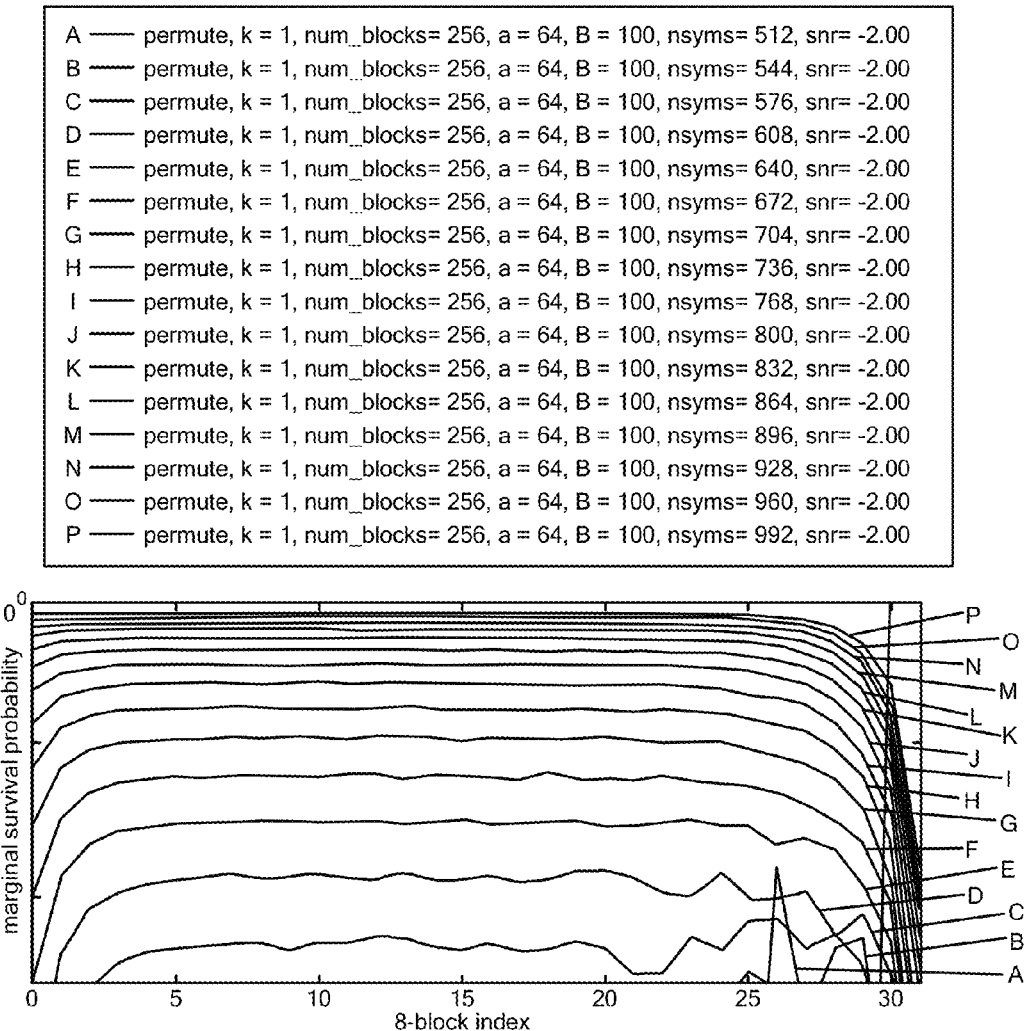
FIG. 15 is a plot of marginal survival probability vs. bit index for 8 blocks of 1 bit each. Y axis between 0.75 and 1.106 packets per line.

We posit that a good puncturing schedule might be obtained using empirical measurements of code behavior, specifically, empirical measurements of the chance of failure at any given i. FIGS. 14 and 15 show marginal survival probability for 1 block and 8 blocks. Marginal survival probability is the probability the decoder would not fail after the given amount of blocks given that it hadn't failed when it started. It isolates the failure probability for a given i from earlier i. The effects of 8-way puncturing are clearly visible in FIG. 14: the indexes that get less symbols are more likely to fail.

FIG. 15 highlights an interesting property: the start of decoding has a higher probability of failing than the middle of decoding.

The total survival probability is the product of all indices' survival probabilities. Equivalently, it is desirable to maximize the sum of log survival probabilities. From empirical measurements like FIG. 14, we can determine the survival probability for any number of symbols for a given spine location.

Consider the logarithm of marginal survival probabilities. If for every location the improvement in log probability (its derivative) is decreasing as more symbols are transmitted, then choosing which symbol to transmit next is easy—one can use the greedy approach since the location with maximum derivative is guaranteed to be the best choice (this can be proven via recursion). Decreasing derivative can be seen to hold in FIG. 15.

Figure 16:
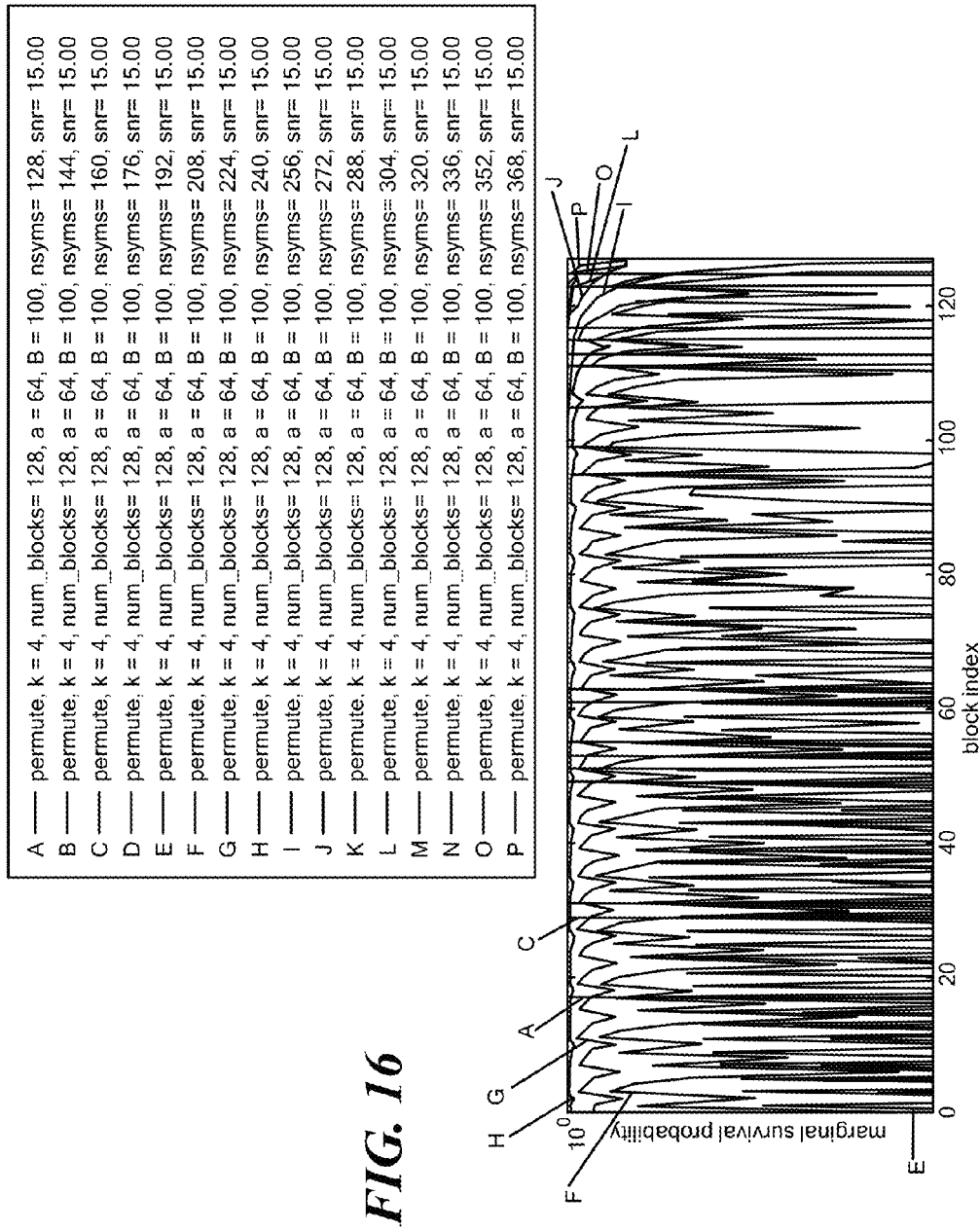
FIG. 16 is a plot of marginal survival probability vs. bit index for blocks of 4 bits. Y axis between 0.9 and 1.105 packets per line.
Figure 17:
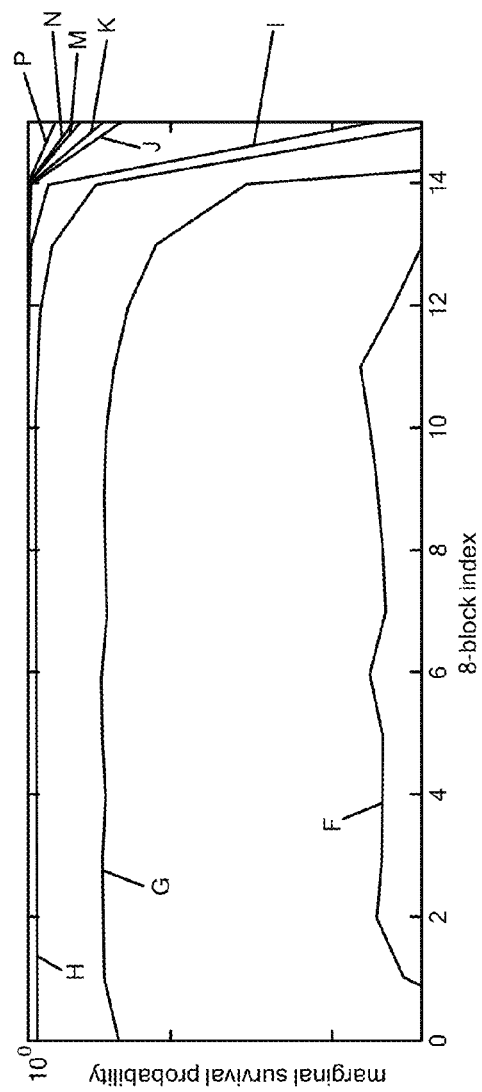
FIG. 17 is a plot of marginal survival probability vs. bit index for 8 blocks of 4 bits each. Y axis between 0.75 and 1.105 packets per line.

FIGS. 16 and 17 show results for a k=4 permute code. They still show a lower survivability rate at the beginning of a permute code run.

Figure 18:
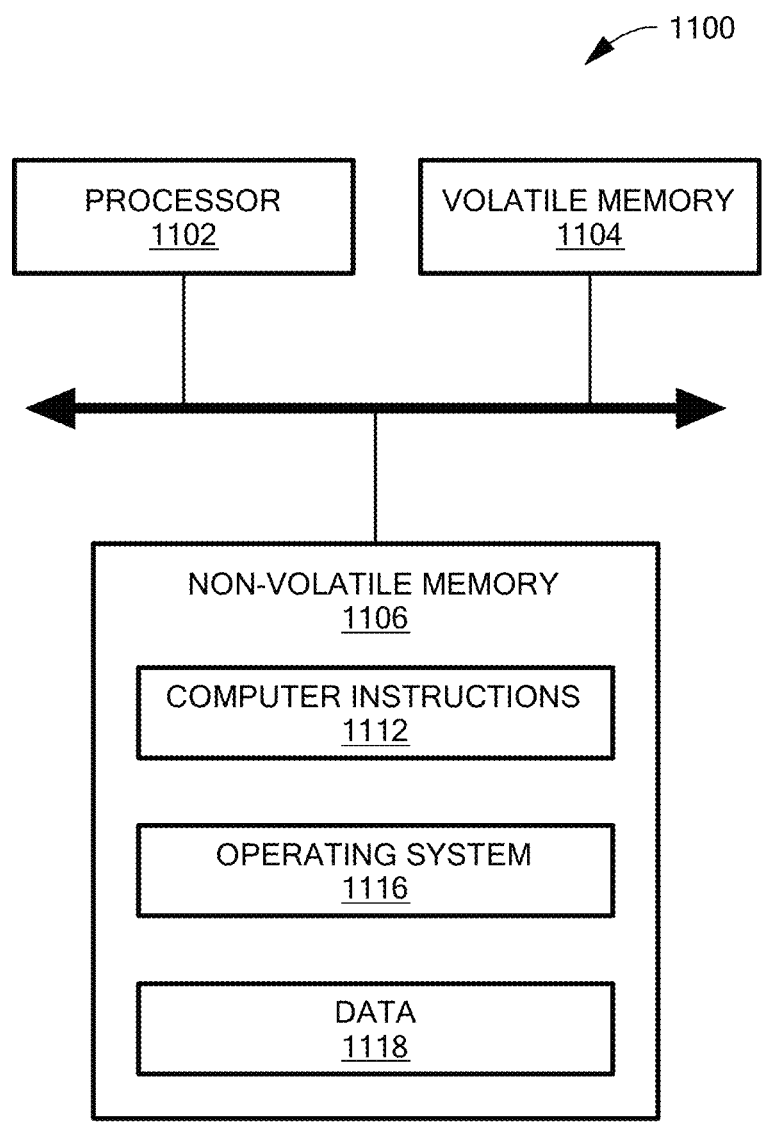
FIG. 18 is a block diagram of an example of a communication device.

Referring to FIG. 18, an example of an implementation of the transmitting device 110, the receiving device 120 or both is a communications device 1100. The communications device 1100 includes a processor 1102, a volatile memory 1104 and a non-volatile 1106. The non-volatile memory 1106 stores computer instructions 1112, an operating system 1116 and data 1118. In one example, the computer instructions 1112 are executed by the processor 1102 out of memory 1104 to perform all or part of the processes described above.

The processes described herein are not limited to use with the hardware and software of FIG. 18; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

Having described preferred embodiments, which serve to illustrate various concepts, structures and techniques which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

What is claimed is:

1. A wireless system, comprising
   an encoder configured to encode data using permute codes comprising pseudo-random permutations of k-bit blocks of the data which uses a permute function over message bits of the data to directly produce a sequence of constellation symbols for transmission; and
   a decoder configured to decode the encoded data;
   wherein k is a positive integer;
   wherein the permute function comprises a seed function that uses previous message bits of the data to seed the pseudo-random permute codes.

2. The wireless system of claim 1 wherein the permute function is a non-linear function.

3. The wireless system of claim 1 wherein the permute function is a hash function.

4. The wireless system of claim 1 wherein the permute code is used in a rateless fashion.

5. The wireless system of claim 1 wherein the decoder is configured to provide feedback to the encoder.

6. A method of operating a wireless system which includes a transmitter and a receiver, the method comprising:
seeding pseudo-randomly generated permute codes with previous message bits of message data
transmitting, via the transmitter, a permute coded message over a wireless channel, the permute coded message included data encoded with the pseudo-randomly generated permute codes; and
receiving, via the receiver, the permute coded message over the wireless channel.

7. The method of claim 6, further comprising providing feedback from the receiver to the transmitter.

8. The method of claim 6, further comprising, at a transmitter:
generating a sequence of symbols by encoding message bits using the pseudo-randomly generated permute codes; and
mapping each symbol to a constellation point.
modulating constellation points on a carrier; and
transmitting a signal using the carrier.

9. The method of claim 6, further comprising, at a receiver:
mapping a signal from an encoder to points on an I-Q plane, the signal comprising constellations encoded using pseudo-randomly generated permute codes; and
decoding the points on the I-Q plane.

10. A method to encode a message, the method comprising:
seeding pseudo-randomly generated permute codes with previous message bits of message data
generating a sequence of symbols by encoding message bits using the pseudo-randomly generated permute codes and; and
mapping each symbol to a constellation point.

11. The method of claim 10, further comprising:
modulating constellation points on a carrier; and
transmitting a signal using the carrier.

12. The method of claim 10, further comprising:
receiving feedback from a receiver; and
determining when to transmit based on an estimate of a distribution of the amount of symbols required to successfully decode.

13. The method of claim 10, further comprising:
dividing a message into non-overlapping segments of size k bits each, wherein k is an integer greater than zero;
determining a series of n/k pseudo-randomly generated permute code values, wherein n is an integer greater than zero; and
generating constellation points by making one or more passes over each of the n/k spine values.

14. A method to decode comprising:
seeding pseudo-randomly generated permute codes with previously received message bits of message data
mapping a signal from an encoder to points on an I-Q plane, the signal comprising message bits encoded using the pseudo-randomly generated permute codes; and
using the pseudo-randomly generated permute codes to decode the points on the I-Q plane.

15. The method of claim 14 wherein the decoding comprises:
exploring a decoding tree iteratively; and
pruning at each iteration all but a defined amount of nodes.

16. The method of claim 14, further comprising providing feedback to the encoder.

17. An encoder comprising:
a non-transitory machine-readable medium that stores executable instructions, the instructions causing a machine to:
seed pseudo-randomly generated permute codes with previous message bits of message data;
generate a sequence of symbols by encoding message bits with the pseudo-randomly generated permute codes; and
map each symbol to a constellation point.

18. The encoder of claim 17, further comprising instructions causing a machine to:
modulate constellation points on a carrier; and
transmit a signal using the carrier.

19. The encoder of claim 17, further comprising instructions causing a machine to:
receive feedback from a decoder; and
determine when to transmit based on an estimate of a distribution of the amount of symbols required to successfully decode.

20. The encoder of claim 17, further comprising instructions causing a machine to:
divide a message into non-overlapping segments of size k bits each, wherein k is an integer greater than zero;
determine a series of n/k permute values, wherein n is an integer greater than zero; and
generate constellation points by making one or more passes over each of the n/k permute values.

21. A decoder comprising:
a non-transitory machine-readable medium that stores executable instructions, the instructions causing a machine to:
seed pseudo-randomly generated permute codes with previous message bits of message data;
map signals from an encoder to points on an I-Q plane, the signals comprising constellations encoded using the pseudo-randomly generated permute codes; and
decode the constellation symbols.

22. The decoder of claim 21 wherein the instructions causing the machine to decode comprises instructions causing the machine to:
explore a decoding tree iteratively; and
prune at each iteration all but a defined amount of nodes.

23. The decoder of claim 21, further comprising instructions causing a machine to provide feedback to the encoder.

24. A method to provide feedback in a wireless system comprising:
obtaining packets;
dividing a packet of N bits into multiple code blocks;
including a cyclic redundancy check (CRC) for each code block;
seeding pseudo-randomly generated permute codes with previous message bits of message data;
encoding the code block using one or more of the pseudo-randomly generated permute codes in a rateless manner;
determining how many passes and puncturing to send; and
transmitting encoded symbols to a receiver.

25. The method of claim 24, further comprising:
receiving the encoded symbols from a transmitter;
decoding the received encoded symbols; and
checking the CRCs.

26. The method of claim 24, further comprising:
sending a feedback signal to an encoder if packets are not all successfully decoded; and
sending a final feedback signal to the encoder if packets are successfully decoded.

27. A wireless system comprising:
a transmitter comprising a non-transitory machine-readable medium that stores a first set executable instructions, the first set of instructions causing a machine to:
obtain packets;
divide a packet of N bits into multiple code blocks;
include a cyclic redundancy check (CRC) for each code block;
seed pseudo-randomly generated permute codes with previous message bits of message data;
encode the code block using one or more of the pseudo-randomly generated permute codes in a rateless manner;
determine how many passes and puncturing to send; and
transmit encoded symbols to a receiver.

28. The wireless system of claim 27, further comprising the receiver comprising a non-transitory machine-readable medium that stores a second set of executable instructions, the second set of instructions causing a machine to:
receive encoded symbols from the transmitter;
decode the received symbols;
check the CRCs;
send a feedback signal to a transmitter if packets are not all successfully decoded; and
send a final feedback signal to the transmitter if packets are successfully decoded.

* * * * *

UNITED STATES PATENT AND TRADEMARK OFFICE
CERTIFICATE OF CORRECTION

PATENT NO. : 9,270,412 B2  
APPLICATION NO. : 14/314347  
DATED : February 23, 2016  
INVENTOR(S) : Jonathan Perry et al.

Page 1 of 2

It is certified that error appears in the above-identified patent and that said Letters Patent is hereby corrected as shown below:

In the Specification

Column 5, Line 10, delete ".Through" and replace with --.Though--

Column 6, Line 40, delete "$s_i$, are are" and replace with --$s_i$, are--

Column 6, Line 48, delete "it is" and replace with --$\pi$ is--

Column 6, Line 52, delete "by the" and replace with --by $\Psi$ the--

Column 8, Line 16, delete "4.96σ." and replace with --4.9σ--

Column 11, Line 23, delete ".$m_{tk+2}$" and replace with --$m_{t+2}$--

Column 11, Line 35, delete "1$^{th}$ pass (1≥1)," and replace with --$\ell$th pass ($\ell$≥1),--

Column 11, Line 40, delete "2c(1-1): for 1=1," and replace with --2c ($\ell$-1): for $\ell$=1,--

Column 11, Line 41, delete "for 1=2," and replace with --for $\ell$=2--

Column 11, Lines 41-42, delete "$b_{2c(1-1)+1},...b_{2c1}$." and replace with --$b_{2c(\ell-1)+1},...b_{2c\ell}$.--

Column 12, Line 6, delete "1$^{th}$" and replace with --$\ell^{th}$--

Column 12, Line 14, delete "1$^{th}$" and replace with --$\ell^{th}$--

Column 12, Line 15, delete "$h_1$:" and replace with --$h_\ell$"--

Column 12, Line 16, delete "1$^{th}$" and replace with --$\ell^{th}$--

Signed and Sealed this  
Eighteenth Day of June, 2019

Andrei Iancu  
*Director of the United States Patent and Trademark Office*

CERTIFICATE OF CORRECTION (continued)
U.S. Pat. No. 9,270,412 B2

Column 12, Line 18, delete "$h_1$" and replace with --$h_\ell$--

Column 12, Line 24, delete "y," and replace with --$y_i$--

Column 13, Line 28, delete "$R_{max/1}$," and replace with --$R_{max/\ell}$,--

Column 17, Line 9, delete "which is" and replace with --which $x_{ij}$--

Column 17, Line 55, delete "non-volatile 1106." and replace with --non-volatile memory 1106.--

In the Claims

Column 19, Line 6, delete "data" and replace with --data;--

Column 19, Line 31, delete "data" and replace with --data;--

Column 19, Line 55, delete "data" and replace with --data;--

Column 21, Line 3, delete "set executable" and replace with --set of executable--